United States Patent [19]
Ridgeway

[11] Patent Number: 6,034,542
[45] Date of Patent: Mar. 7, 2000

[54] BUS STRUCTURE FOR MODULARIZED CHIP WITH FPGA MODULES

[75] Inventor: David J. Ridgeway, Los Gatos, Calif.

[73] Assignee: Xilinx, Inc., San Jose, Calif.

[21] Appl. No.: 08/950,252

[22] Filed: Oct. 14, 1997

[51] Int. Cl.[7] .............................................. H03K 19/177
[52] U.S. Cl. .................................. 326/39; 326/38; 326/41
[58] Field of Search .................................. 326/41, 38, 39, 326/47

[56] References Cited

U.S. PATENT DOCUMENTS

| | | | |
|---|---|---|---|
| 4,758,745 | 7/1988 | Elgamal et al. | 326/41 |
| 4,847,612 | 7/1989 | Kaplinsky | 326/39 |
| 4,870,302 | 9/1989 | Freeman | 326/41 |
| 5,448,185 | 9/1995 | Kaptanoglu | 326/39 |
| 5,572,148 | 11/1996 | Lytle et al. | 326/41 |
| 5,621,650 | 4/1997 | Agrawal et al. | 326/41 |
| 5,726,584 | 3/1998 | Freidin | 326/38 |
| 5,828,229 | 10/1998 | Cliff et al. | 326/38 |
| 5,838,165 | 11/1998 | Chatter | 326/38 |

*Primary Examiner*—Huan Hoang
*Assistant Examiner*—Gene N. Auduong
*Attorney, Agent, or Firm*—Edel M. Young; David G. Alexander

[57] ABSTRACT

An on-chip bus structure for use in a modularized integrated circuit chip including an FPGA module(s). The bus is intended for memory mapped data transfers between circuit modules, for instance master, slave, master/slave, bus controller, and bus monitor type modules. Each circuit module is an on-chip function block including a bus interface and communicates by a predefined set of bus signals; at least one module is an FPGA (field programmable gate array). Each module acts as a bus master when it initiates data read or write operations, or may be addressed during a bus read/write operation and thereby acts as a bus slave. This bus and module structure allows implementation of a system on a single chip.

27 Claims, 16 Drawing Sheets

Timeout Initiated Termination - Low Latency

Timeout Initiated Termination - High Bandwidth

ROUND ROBIN ROTATION

FIXED PRIORITY 6,034,542

BUS STRUCTURE FOR MODULARIZED CHIP WITH FPGA MODULES

FIELD OF THE INVENTION

This invention relates to integrated circuits and more specifically to modular integrated circuits including modules which are FPGAs (field programmable gate arrays).

DESCRIPTION OF THE RELATED ART

There is a general tendency towards increasing complexity of integrated circuits (chips), i.e. putting more and more of a computer system or other type of electronic system functionality on a single integrated circuit chip. This typically requires a chip which includes a number of circuit modules, each performing a particular function, and which are interconnected. The interconnections amongst the circuit modules are problematic since the modules are each typically custom designed, resulting in significant complexity and expense in the interconnections. Further, such interconnections tend to be inflexible. It would be highly desirable to achieve a systematized and flexible approach to connecting circuit modules on an individual chip.

SUMMARY

In accordance with this invention, an on-chip interconnect bus is used in a modular integrated embedded system on-chip where at least some of the integrated circuit modules are FPGAs. The bus is intended for memory mapped data transfers between the circuit modules, but is not so limited. The bus interconnects a number of different types of modules which function as master, slave, master/slave, bus controller, and bus monitor. There may be several master, slave, or master/slave modules on a particular integrated circuit. Each module includes a bus interface and communicates with the other modules on the bus via a set of specified bus signals. The bus interface may be formed from dedicated circuits or programmable circuits. The programmable bus interface circuits may include both configurable wiring and blocks of configurable logic. While some module(s) are FPGAs, others are "core logic" (i.e. not programmable in terms of functionality, such as memory or a processor). Modules act as bus masters when they initiate data read or write operations. The module which is addressed during a read/write operation acts as a bus slave.

Advantageously a bus structure in accordance with this invention allows implementation (design) of on-chip systems and multi-chip systems by easily integrating the modules on a chip by interconnecting them using the bus. Advantageously, by use of conventional FPGA programming techniques there is a great flexibility in determining the functionality of the FPGA modules and the bus interfaces.

DETAILED DESCRIPTION

Figure 1:
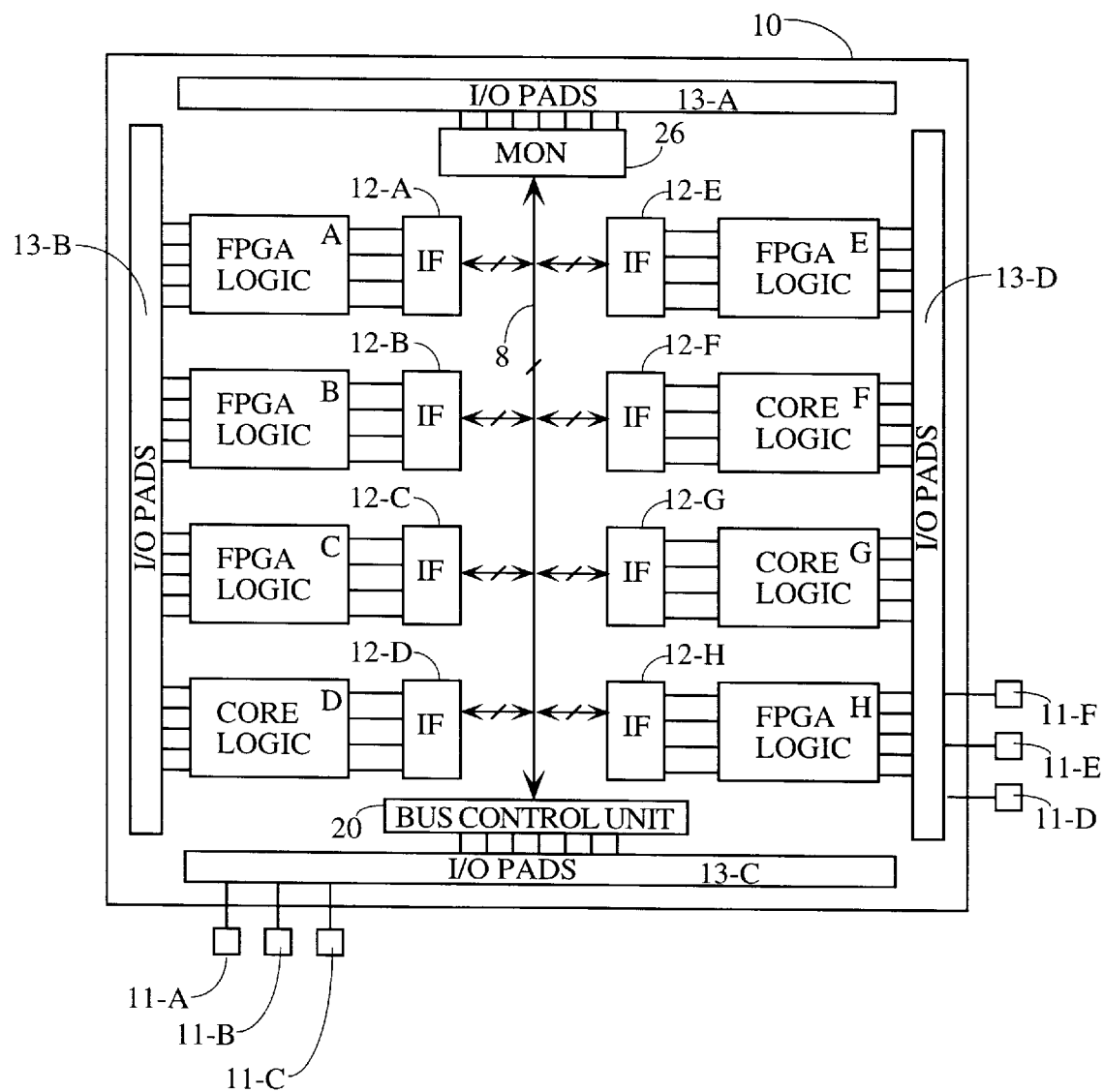
FIG. 1 shows a bus structure in accordance with this invention on an integrated circuit including FPGA modules.

FIG. 1 shows an integrated circuit chip 10 including an on-chip multi-line bus 8. The chip includes a number of modules A, B, C, D, E, F, G and H. While eight modules are shown, this is merely illustrative and there may be more or fewer modules. The FPGA logic modules A, B, C, E and H are each an FPGA (field programmable gate array) of the type now commercially available as an individual integrated circuit chip from for instance Xilinx, Inc.

For instance the commercially available Xilinx XC4000 Series FPGAs include two dimensional arrays of lookup tables (LUTs) with a fixed number of vertical and horizontal wiring channels. Since such FPGAs are well known, their internal detail is not illustrated. Such an FPGA typically includes three types of routing resources: local, long and global lines. Local lines run short distances between adjacent logic and are for low fan-out nets; long lines run all or half the device width or length and are excellent for high fan-out or low skew nets. Global lines distribute signals throughout the whole array and are good for extremely high fan-out or extremely low skew nets. The local and long lines are distributed along each of the horizontal and vertical axes, whereas global lines may be laid out like a comb with a spine extending along a horizontal axis and full-length comb teeth distributed in the vertical axis. These routing resources are programmably connectable at programmable interconnection points (PIPs). Global lines are driven by dedicated global buffers powerful enough to support the wide signal distribution.

The primary logic resource in an FPGA is a set of configurable logic blocks each consisting of, in one example, three LUTs (look up tables), two flip-flops, and two carry generators. The LUTs may be configured either as function generators or as random access memories. It is to be understood therefore that the integrated circuit of FIG. 1 includes one or more such FPGAs on the integrated circuit chip 10. The FPGAs may be of different sizes depending on the application and the physical limitations of the IC device.

Also included in at least some embodiments are "core logic" modules, for instance core logic modules F and G. These core logic modules are not FPGAs but are conventional dedicated ("hard wired") logic or other circuitry and hence not programmable in functionality in the sense that an FPGA is programmable. Thus this allows implementation of a system on a chip including both core logic and FPGAs.

Also included on the integrated circuit chip 10 is the dedicated bus 8, which is not the same as the interconnect routing resources of the individual FPGAs.

Each circuit module A, B, C, etc. has an associated bus interface 12-A, 12-B, etc. which communicates with other module bus interfaces via the bus signals described below. The modules each act as bus masters when they initiate data read or write operations once bus ownership has been granted. The bus module addressed during a bus operation acts as a bus slave when it performs the requested data read or write operation. To operate, the chip 10 includes programmable bus controller 20 which performs arbitration, address decoding, and timeout control functions.

A structure as in FIG. 1 is especially useful for integrating a system on a chip, i.e. integrating the functions of several conventional integrated circuits onto a single chip. Such a device is typically pin limited, meaning there is a relatively scarce number of in/out terminals (pins) for connecting the chip 10 to the outside world. Hence typically particular pins may be used for multiple purposes. For instance, certain pins may be used for programming the FPGA modules in the programming mode and for carrying data, address or other signals in the normal operating mode.

Each of the modules A, B, etc. is connected respectively to the bus 8 via an intervening interface (IF) 12-A, 12-B, described in further detail below. These interfaces allow use of a standard protocol for the bus since each module, while it may take any one of a large number of forms, interconnects to the bus 8 via the associated interface. Thus the interfaces allow use of a standardized bus 8, in spite of the presence of non-standarized circuit modules.

Also shown are conventional I/O pads 13-A, 13-B, 13-C, 13-D; each of these represents a large number of such I/O pads but is shown as a block for simplicity. Also shown are various I/O pins (terminals) 11-A, 11-B, etc. connected variously to the I/O pads; only a few pins are shown. It is to be understood that in reality there are a large number of I/O pins extending out from the chip package, in some cases extending from the entire underside of the chip, and connected internally to pads distributed around the perimeter of the chip 10.

Each interface circuit 12-A, 12-B, etc. in one embodiment is a programmable logic interface (e.g. an FPGA) which can be programmed to function as a slave, a master or a master/slave as described further below. Alternatively, the interfaces are not programmable but are hard wired. The bus control unit 20 in one embodiment is also programmable (e.g. an FPGA) and includes an arbitration function (hence is designated ARB in FIG. 1) to select the master and slave connections so that any one module may communicate with another module.

The bus control unit 20 may be either dedicated (hard wired) circuitry or programmable circuitry, e.g. of FPGAs. The configuration commands needed for configuring each of these FPGAs may be transmitted over the bus 8. For example, the IC device may power up in a configuration mode in which bus control unit 20 is configured to receive configuration bits from external pads and to transmit these configuration bits through bus 8 to interface units IF, configuring the interface units IF to transmit configuration bits to FPGA and CORE logic units A through H. Alternatively, bus control unit 20 stores a nonvolatile configuration mode in flash or other nonvolatile cells, and adopts this programmable configuration at power-up. After configuration is complete, bus interfaces IF are reconfigured for bus operation. Alternatively, the various FPGA's are programmed by configuration signals supplied by chip I/O pins connected directly to a particular FPGA, without use of bus 8. The configuration commands can be provided by any suitable source, including from an on-chip memory.

The present bus structure accelerates implementation (e.g. by system designers) of bus systems. Modules with the present bus interface can be easily integrated into a modularized integrated circuit even if designed by different designers or manufacturers.

Figure 2:
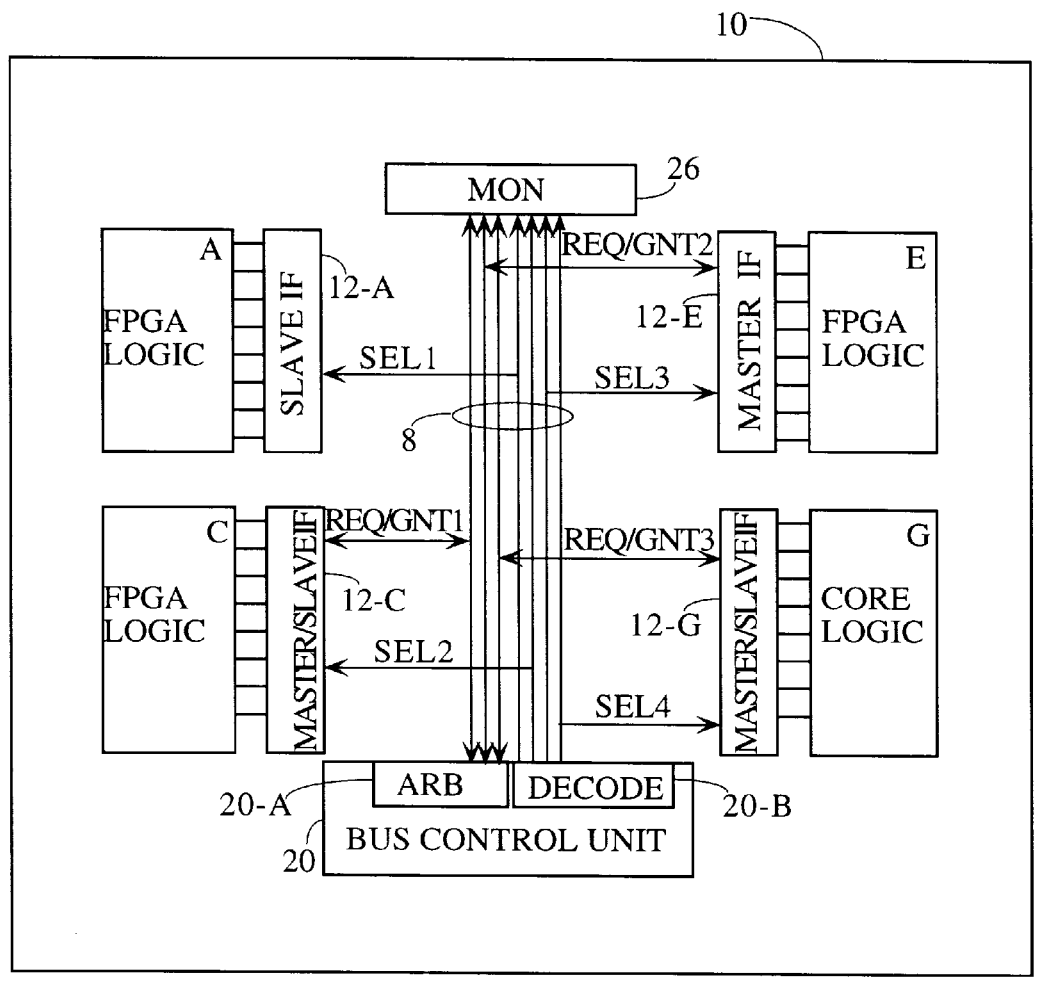
FIG. 2 shows an implementation of part of the structure of FIG. 1.

FIG. 2, showing some of the same structures as FIG. 1 (but omitting certain elements for greater clarity), illustrates in more detail the interconnection of the bus interface (IF) modules and the various types of interfaces. The sequences of request (Req) and grant (Gnt) signals needed by the master and slave interfaces to perform bus operations are shown. FIG. 2 shows a master interface 12-E, master/slave interfaces 12-C, 12-G and a slave interface 12-A connected by the signal lines of bus 8 to a dedicated bus control unit 20 including arbitration ("ARB") logic 20-A and address decoding logic 20-B. In one embodiment, logic functions implemented in FPGA logic unit C drive the interface 12-C to access the system resources. The on-chip bus monitor 26 observes the bus signals and provides informational, warning, and error messages, e.g. to external pins for analysis. In one embodiment, bus monitor 26 includes a timing checker for maintaining bus timing and a protocol checker for specifying the master/slave interactions.

The module address decoding function represented by decoder 20-B in FIG. 2 can be located in the bus control unit 20 as shown or may be decentralized for a decentralized arbitration scheme, with the arbitration logic distributed among each of the interfaces 12-A, etc. In this case there is no central arbitration. The arbitration scheme can be any known arbitration scheme and the nature of the arbitration circuit 20-A and its location are dependent on the particular arbitration scheme.

Bus Signal Definition

Figure 3:
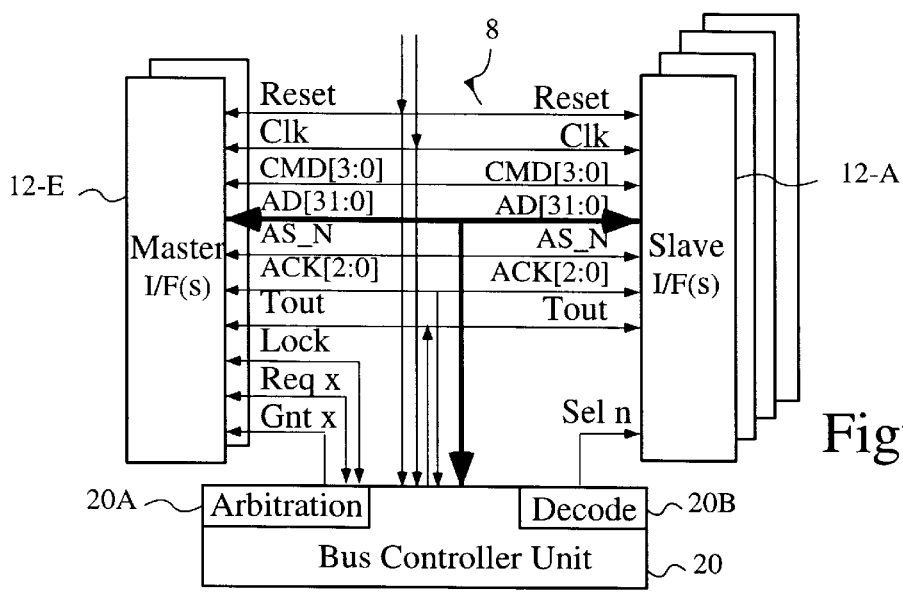
FIG. 3 shows bus signals defined in accordance with one embodiment of this invention.

FIG. 3 shows the bus 8 signal lines (also shown in part in FIG. 2) routed between two master interfaces 12-E, four slave interfaces 12-A and one central bus controller unit 20. Table I below describes the various signal lines, where I means input, 0 means output, and T.S. means tri-state.

TABLE I

| Signal Name | Signal Type | Pin Definition |
|---|---|---|
| RESET | I | Hardware Reset: During the circuitry power-up phase RESET is used to bring specific registers and signals to a constant state. Anytime RESET is asserted, all output signals must be driven to their benign state. |
| CLK | I | Bus Clock: Bus cycle timing is referenced to the rising edge of the bus clock (CLK). All signals are sampled on the rising edge of CLK and all timing parameters are defined with respect to this edge. |
| AD[31:0] | I/O T.S. | AD[31:2] Address/Data Bus Lines: Address and Data are multiplexed on the same lines. A bus transaction consists of an address phase followed by one or more data phases. The address phase is the clock cycle in which AS_N is asserted. During the address phase AD[31:0] contains a physical address (32 bits). During data phases AD [7:0] contain the least significant byte (LSB) and AD[31:24] contain the most significant byte (msb). Write data is stable and valid when AS_Nn is deasserted and read data is stable and valid when ACK[2:0] is asserted with a ready code. Depending on the transfer direction of the bus operation, data bus lines are driven either by the granted master or by the selected slave early during a data cycle. |
| AD[1] *contents of AD[1] during address phase | | SINGLE/burst: This bus line is driven by the master during the address cycle to inform the selected slave about the length of data transfer during the data cycles. During data phases AD[7:0] contain the least significant byte (LSB) and AD[31:24] contain the most significant byte (MSB). <br><br> AD[1] = 0: Burst - Undefined burst data transfer <br> AD[1] = 1: Single - Single data transfer |
| AD[0] contents of AD[0] during address phase | | READ/write: This bus line is driven by the master during the address cycle to inform the selected slave about the direction of the data transfer during the following data cycles. During data phases AD[7:0] contain the least significant byte (LSB) and AD[31:24] contain the most significant byte (MSB). <br><br> AD[0] = 0]    Write - Data transferred from master to slave. <br> AD[0] = 1    Read - Data transferred from slave to master. |
| AS_N | O T.S. | Address Strobe: is provided by the master to latch the address into the slave address latches. AS_N is active low. AS_N is asserted every address phase and is also asserted during the following data phase. |
| CMD[3:0] | I/O T.S. | Bus Command: during the address phase of a transaction, CMD[3:0] defines the bus command. During the data phase CMD[3:0] is used to signal that the end of the burst is approaching. Slaves must latch the command when AS_N is asserted, then monitor CMD for the NOP command to get a pipelined signal of transaction end. |

| CMD[3:0] | Identifier | Description |
|---|---|---|
| 00mn | BYTx | Byte transfer (undefined length transfer) <br> m,n 0,0; 8-bit transfer on AD[7:0](x = 0) <br> m,n = 0,1; 8-bit transfer on AD[15:8] (x = 1) <br> m,n = 1,0; 8-bit transfer on AD[23:16] (x = 2) <br> m,n = 1,1; 8-bit transfer on AD[31:24] (x = 3) |
| 010a | WDx | Word transfer <br> a = 0, 16-bit Transfer on AD[15:0] (x = 0) <br> a = 1, 16-bit Transfer on AD[31:15] (x = 1) |
| 011a | DWx | Double Word transfer <br> a = 0, 32-bit Transfer on AD[63:32] (x = 0) <br> a = 1, 32-bit Transfer on AD[31:0] (x = 1) |
| 10mn | BYTx | Byte transfer <br> m,n = 0,0; 8-bit transfer on AD[39:32] (x = 4) <br> m,n = 0,1; 8-bit transfer on AD[47:40] (x = 5) <br> m,n = 1,0; 8-bit transfer on AD[55:48] (x = 6) <br> m,n = 1,1; 8-bit transfer on AD[63:56] (x = 7) |
| 110a | WDx | Word transfer <br> a = 0, 16-bit Transfer on [47:32] (x = 2) <br> a = 1, 16-bit Transfer on [63:48] (x = 3) |
| 1110 | QW2 | Full 64-bit Quad Word Transfer |
| 1111 | NOP | No operation, last data for undefined length block transfers. |

| Signal Name | Signal Type | Pin Definition |
|---|---|---|
| ACK[2:0] | I/O T.S. | Acknowledge Code Lines: Acknowledge code bus lines are driven by the selected slave early during a data cycle or in case no slave has been selected in the previous bus cycle by bus control (error case). |

| ACK[2:0] | Identifier | Description |
|---|---|---|
| 000 | SPT | Reserved for split, split response not defined |
| 001 | RD0 | Ready-Last, bus cycle completed, slave can do no more transfers. |
| 010 | RD1 | Ready One-More, bus cycle completed, slave do one more transfer. |
| 011 | RDM | Ready-More, bus cycle completed, slave can do two or more transfers. |

TABLE I-continued

| Signal Name | Signal Type | Pin Definition | | |
|---|---|---|---|---|
| | | 100 | RSD | Reserved |
| | | 101 | RTR | Retry, last bus cycle aborted. |
| | | 110 | ERR | Error, last bus cycle aborted |
| | | 111 | WAT | Wait, bus cycle not completed |
| TOUT | I | Timeout: This signal is driven by bus control unit. TOUT may be asserted during a bus transfer if a slave device is not terminating a bus operation within a given time limit. An active TOUT causes any master or slave to stop driving any bused line, starting from the following bus cycle. An ongoing bus transfer is aborted. | | |
| | | TOUT = 0 | | Normal Operation |
| | | TOUT = 1 | | Timeout, the active master and slave shall instantly abort their activity. |
| SEL_N | I | Slave Select: This signal is generated by bus control from CMD[3:0] and A[31:2] information during an address cycle SEL_N = I Slave is not selected for the current bus operation and shall remain idle. SEL_N = 0 Slave is selected for the current bus operation. (The slave needs to register address, CMD, data before SEL asserts, in case it is indeed selected). | | |
| REQ_N | O | Master Request: REQ_N is driven by a master to request bus ownership from the bus control unit. | | |
| | | REQ_N = 0 | | Request for bus ownership |
| | | REQ_N = 1 | | No request for bus ownership |
| GNT_N | I | Master Grant: Bus control unit asserts GNT_N after arbitration to indicate to a master that its request for bus ownership was accepted. GNT_N is asserted in idle cycles or in the last data cycle of a bus transfer. Only one GNT N may be active at the end of a bus cycle. | | |
| | | GNT_N = 0 | | Master gets bus ownership at the end of the current cycle or immediately if the bus is idle. |
| | | GNT_N = 1 | | Master does not get bus ownership in the next bus cycle. |
| LOCK_N | O T.S. | Lock (chain) bus operations: A master drives this single bus line during the address cycle to indicate to the bus control that another bus operation shall be chained to the current one. When LOCK_N is asserted, bus control shall not give any GNT N in tile following data cycle. | | |
| | | LOCK_N = 0 | | Master wants to chain the next bus operation and does not give up bus ownership. Arbitration shall be inhibited. |
| | | LOCK_N = 1 | | Bus control may perform arbitration and assign bus ownership on termination of the current bus operation. |

Bus Operation

The bus protocol specifies the interaction between two resources: the master interface 12-E and slave interface 12-A. This protocol defines a protocol for any bus master to read data from and write data to (access) any slave. The bus protocol supports "single" and "burst" read and write access cycles. Before a bus transaction can start, a master must request bus ownership. To minimize access latency, the bus arbitration approach is access-based rather than time-slot based. The bus 8 uses a central arbitration scheme, where each master has a unique request signal REQ_N and a unique grant signal GNT_N signals shown in FIG. 2. The bus request, arbitration, and data transfer cycles form a complete bus transaction. The following terms describe the bus protocol:

bus transaction: The time from a master's requests to the time the slave acknowledges the last data transfer cycle.

data transfer: A read or write operation of a data value, which may take one or more bus cycles. The bus transfer is terminated by a completion acknowledgment response from the addressed slave. In one embodiment, the data transfer sizes supported include Byte (8-bit), Word (16-bit), Double word (32-bit) and Quad Word (64-bit).

bus cycle: The smallest unit of bus control (defined at rising-edge clock transitions). There are three types of bus cycles: address, data, idle. A bus address cycle takes two clock cycles. A bus data cycle takes from two clock cycles up to a number of clock cycles equal to the number of data transfer cycles in a burst transaction. An idle bus cycle takes one clock cycle.

Bus Transactions

FIGS. 4 to 18 are timing diagrams which show for one illustrative embodiment such as shown in FIG. 3 the relationship of signals involved in various types of bus transfers. In FIGS. 4–18, when a signal is shown as a solid line, the signal is actively being driven by the current master or slave. When a signal is shown as a dashed line, no master or slave is actively driving the signal. Tri-stated signals are indicated to have indeterminate values when the dashed lines are between the two rails. When a solid line becomes a dashed line, it indicates the signal was actively driven and now is tri-stated. When a solid lines makes a low to high transition and then becomes a dashed line, it indicates the signal was actively driven high to precharge the bus, and then tri-stated.

Figure 4:
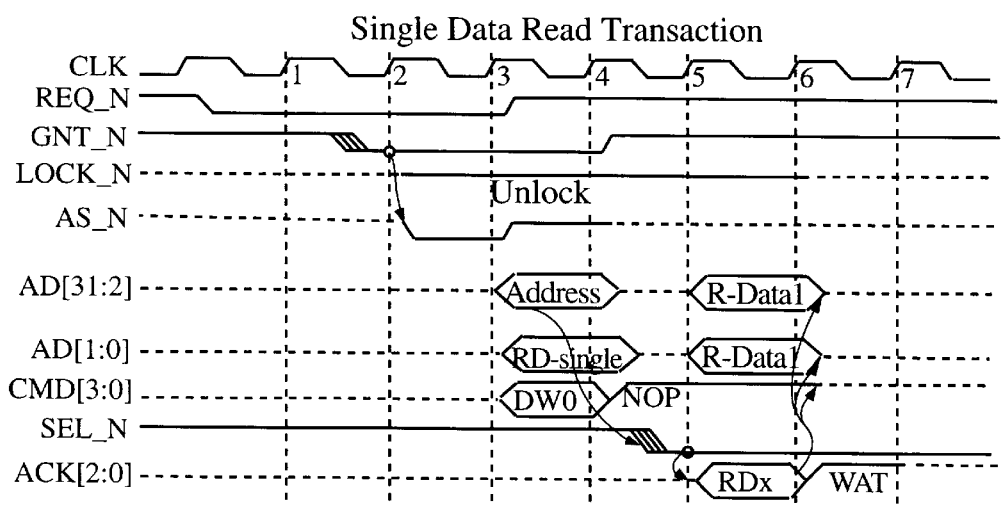
FIG. 4 shows a timing diagram for a single data read transaction.

Single Data Read Transaction—FIG. 4

FIG. 4 shows the timing for a single data read transaction for bus 8 of FIG. 3. The bus uses a piplined protocol which divides each bus transaction into a number of distinct stages, beginning with the arbitration phase at clock cycles 0 and 1, followed by the address/command phase at clock cycles 2 and 3, the decode phase at clock cycle 4, and concluding with the data transfer phase at clock cycles 5 and 6.

The arbitration phase begins when a master such as 12-E of FIG. 3 asserts REQ_N and does not complete until the requesting master receives an asserted GNT_N signal from the central bus arbiter 20-A. This asserted GNT_N signal is the arbiter's response to an asserted REQ_N signal prior to clock cycle 1. The master may start a transaction at clock cycle 2 because AS_N is deasserted and GNT_N is asserted.

The address/command phase begins when AS_N is asserted and occurs on clock cycle 2. The address AD[31:2], bus direction AD[0], transaction length AD[1] and bus command CMD[3:0] become valid in clock cycle 3 and remain valid at the beginning of clock cycle 4. It is important to note, because AS_N is pipelined, slaves such as 12-A of FIG. 3 can use the registered signal AS_N to latch the address and commands on clock cycle 4.

On clock cycle 2, LOCK_N is deasserted by the master, indicating to the central bus arbiter 20-A that the master will relinquish control and stop driving the bus at the end of the current transaction.

The first clock cycle of the read data transfer phase requires a turn-around cycle which occurs on clock cycle 4. In this case, the address must be valid on clock cycle 3. Then the master stops driving AS_N, AD[31:0] and CMD[3:0] during clock cycle 4. A centralized address decoder 20-B generates individual select signals, SEL_N, for each access in the address range(s) assigned to that slave. The earliest the slave can provide data is clock cycle 5.

The read data transfer phase completes in clock cycle 6 after the slave puts read data on AD[31:0] lines and acknowledges the master's command via the ACK[2:0] lines. ACK[2:0]=RDx indicates that the read data is valid. ACK[2:0]=RDx also informs the central bus arbiter that another master may be granted the bus. It is important to note, because AS_N is pipelined, slaves can use registered AS_N to latch the address and commands on clock cycle 4.
Read Burst Operation with One Wait Cycle—FIG. 5

Figure 5:
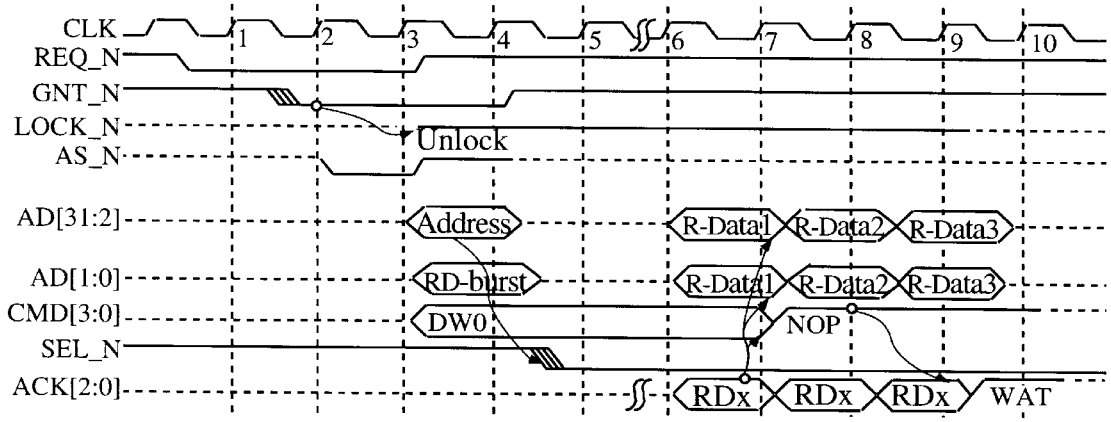
FIG. 5 shows a timing diagram for a read burst operation with one wait cycle.

During indeterminate-length read transactions, multiple data words are transferred from one slave to one master starting at the address specified during the address phase and linearly incrementing from that address. FIG. 5 illustrates an indeterminate length read transaction.

Indeterminate length read transactions have the same arbitration phase and address/command phase as do the single read transactions of FIG. 4 with the only exception being the transfer length AD[1]=RD–BURST during the address/command phase at clock cycle 3, and of course the resulting indeterminate number of read transactions (shown as three transactions occurring on clock cycles 6, 7, and 8).

Not all peripherals will be able to respond immediately following the turn-around cycle (clock cycles 4) in the read data transfer phase. Slaves may delay the first data transfer cycle over several bus cycles. This may be achieved by the use of the wait acknowledge signal ACK[2:0]=WAT indicated in FIG. 5 by the line break at clock cycle 5. FIG. 5 shows that the wait acknowledge signal ACK[2:0] sends a RDx signal at clock cycle 6. It is important to note, however, that because the data transfer cycles are pipelined it is not possible for slaves to insert wait-states between individual data transfer cycles of an indeterminate length read or write transaction.

The first read data transfer takes place when a slave puts the first read data on AD[31:0] and acknowledges the master's command with Ready-More ACK[2:0]=RDM which occurs on clock cycle 6. The master knows at clock cycle 7 that two data phases remain in this transaction. To indicate to the slave that the data phase is ending, the master asserts CMD[3:0]=NOP on the next to last dock cycle 7. During clock cycle 7, the slave drives AD[31:0] with the next to last data and asserts slave acknowledge ACK[2:0]=RDx. The slave registers the CMD[3:0]=NOP on clock cycle 8. The slave decodes a NOP from the registered CMD one clock cycle later, coincident with the last data transfer, and the transaction terminates on clock cycle 9.

It is important to note, however, that because the data transfer cycles are pipelined, slaves are allowed one additional clock cycle to decode the NOP command and terminate the indeterminate length transaction.

The address strobe for a new cycle can be inserted as early as clock cycle 9, which is a required turn-around cycle for AD[31:0] when bus mastership is changing.
Write Transactions Write transactions follow the same bus protocol as the read transactions for both the arbitration phase and address/command phase. The data phase is also similar, except no turnaround cycle is required following the address phase because the master provides both address and data.
Single Data Write Transaction—FIG. 6

Figure 6:
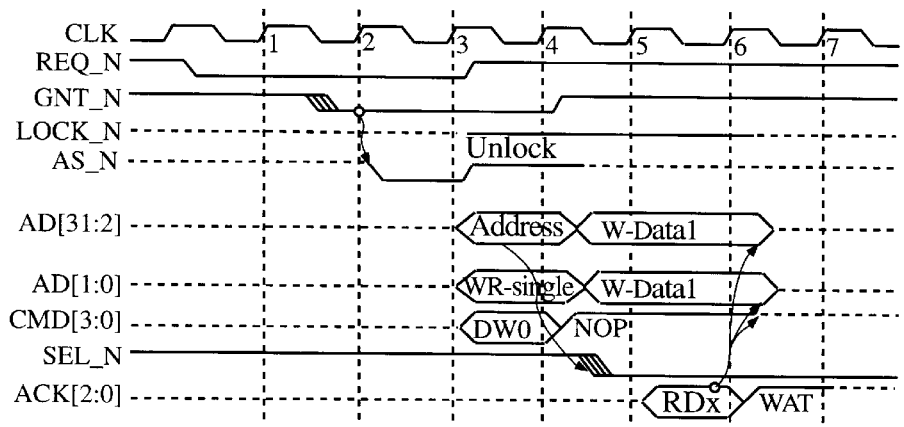
FIG. 6 shows a timing diagram for a single data write transaction.

In the write transactions of FIG. 6, the address is valid on clock cycle 3, and then the master starts driving data onto AD[31:0] on clock cycle 4. During clock cycle 4, the address decoder asserts slave select SEL_N, and the earliest the slave can accept data is clock cycle 5. The write data transfer takes place when the slave acknowledges the master's command with Ready-More ACK[2:0]=RDM which occurs on clock cycle 6.
Write Burst Operation—FIG. 7

Figure 7:
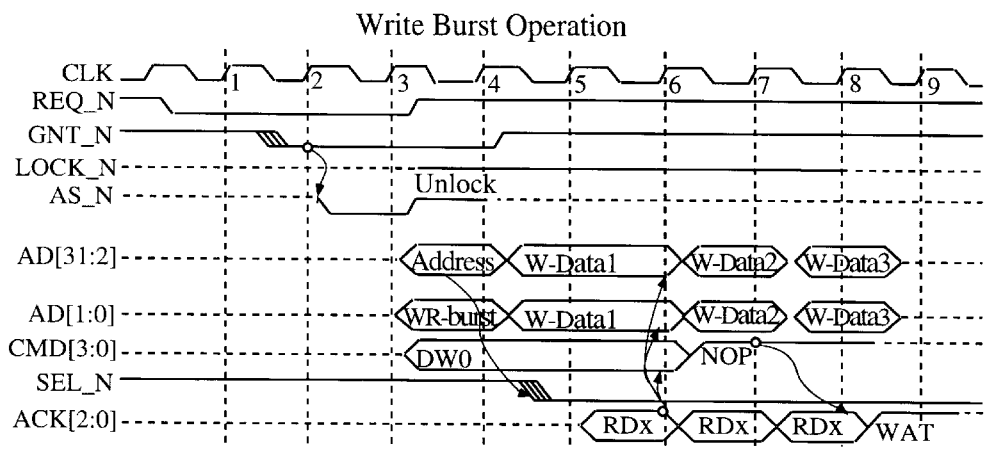
FIG. 7 shows a timing diagram for a write burst transaction.

During an undefined length write burst transaction, multiple data words are transferred from one master to one slave starting at the address specified during the address phase and linearly incrementing from that address. FIG. 7 illustrates an undefined length write transaction. Transactions up thorugh clock cycle 5 are the same as FIG. 6 except that address lines AD[1:0] specify a burst operation. On the next-to-last clock cycle 6, to indicate to the slave that the data phase is ending, the master asserts CMD[3:0] and NOP. During clock cycle 7, the master drives AD[31:0] with the last data. On clock cycle 7, the slave registers the CMD[3:0]=NOP. One clock cycle later, on clock cycle 8, the slave decodes the NOP command from the registered value of CMD, coincident with the last data transfer, and the transaction terminates on clock cycle 8.
Read-Modify-Write Transaction—FIG. 8

Figure 8:
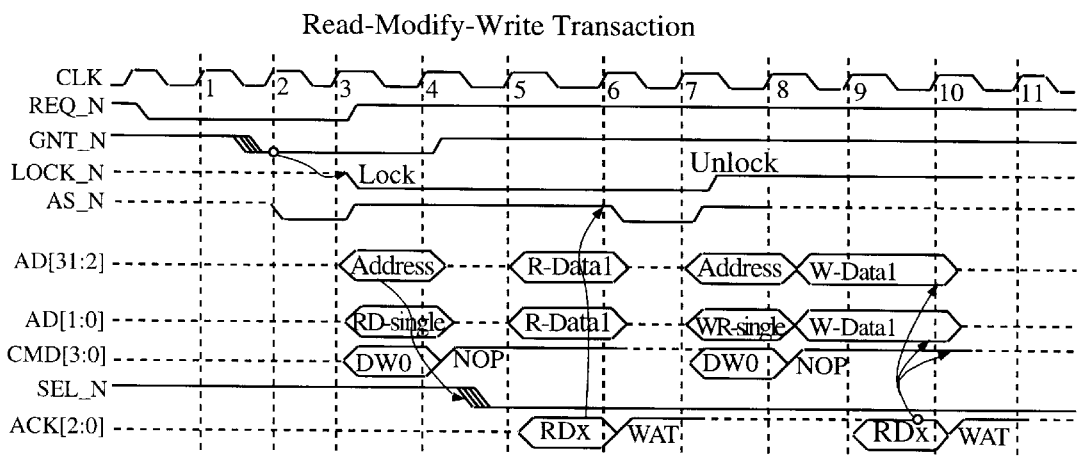
FIG. 8 shows a timing diagram for a read-modify-write transaction.

It is also possible for one master to continuously use bus 8 to read data and then to write data without releasing access to the bus. FIG. 8 shows such a transaction. This is a locked transaction in that the master maintains control during clock cycles 3–6. The protocol of FIG. 8 requires fewer clock cycles to perform the combined read and write operations than two separate read and write transactions would require.
Special Considerations for Locked Transactions Since SEL_N stays asserted between the read and the write cycle of the read-modify-write transaction, the write cycle RDx could come on clock cycle 6, one clock cycle earlier than shown in FIG. 5. The slave would know that the data is valid one clock cycle after the registered AS_N signal has been received, and so the protocol could avoid that wait state. Similarly, the second address strobe can occur one clock cycle later than shown, although this does not give optimal performance.

LOCK_N is sampled only on the same clock edge at which the address is sampled (eg clock cycles 4 and 8) and LOCK_N is a don't care signal at all other times (except for setup and hold). Thus, one can use the state of LOCK_N on clock cycle 5 to indicate something else. For example, if the clock cycle was locked, then an early de-assertion might mean that the following clock cycle is a WRITE to the same address thereby saving a clock cycle by eliminating the address phase (but not the AS_N) and sending the data one clock cycle earlier.
Transaction Termination Conditions Termination of transactions may be initiated by either the master or the slave. While neither can actually stop the transaction unilaterally, the master remains in ultimate control, bringing all transactions to an orderly and systematic conclusion regardless of what caused the termination. Single data transactions are terminated by the Ready-Last slave acknowledge signal ACK[2:0]=RD0. Burst transfer termination entails signaling by the master or the slave during the last two clock cycles of a transaction to indicate the end of the transfer or the need to end the transfer.

Slave Initiated Termination

When the slave is unable to complete a request, the slave may use several types of slave acknowledge ACK[2:0] signals to initiate termination of the transaction. The acknowledge type indicates to the master something about the condition which lead to the termination. The four types of slave initiated termination transactions are (1) count-down, (2) retry without data, (3) retry with data, and (4) error termination.

1. Count-Down Termination

Figure 9:
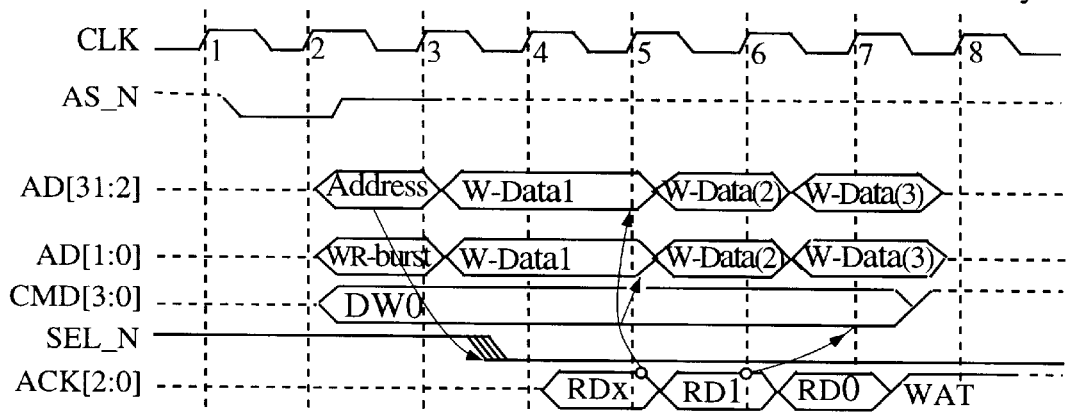
FIG. 9 shows a timing diagram for a slave countdown termination with two or more data transfer cycles.

FIG. 9 shows a slave initiated count-down terminaltion with two or more data transfer cycles. A count-down termination is a termination of an indeterminate length transaction in which the master began the desired transaction; however, due to some internal condition, the slave needs to terminate the master's intended transaction. This is a pipelined termination where the slave brings the transaction to a halt by signaling to the master to complete only two more data phases (ACK[2:0]=RD1) followed immediately by the final data acknowledge (ACK[2:0]=RD0). This is the most desired method for slave initiated termination. Note that the countdown termination is an implicit retry to a master that has not reached its own termination condition. To avoid the inefficiency of the RTR ACK, the slave should employ the countdown termination.

In FIG. 9, the master initiates an indeterminate length bus transaction in which the first data phase completes on clock cycle 5. The slave knows on clock cycle 5 that it can only complete two more data phase in this transaction. The slave asserts ACK[2:0]=RDY1 on clock cycle 5 and completes the second to last data phase on clock cycle 6. During clock cycle 6 the master drives AD[31:0] with the last data, and the slave terminates the transaction by driving ACK[2:0]=RD0. When the master detects RD1 on the registered ACK, it realizes that the current data transfer is the last and terminates. During clock cycle 7 the master tri-states AD[31:0] and the slave drives ACK to WAT.

Count-Down termination can be used by a slave to terminate indeterminate length transactions with two or more data phases. If a slave can only complete two data phases, the slave would initiate the count-down termination condition during the first data phase.

2. Retry Without Data

Both Write and Read transactions can be terminated without data transfer. Such a transaction occurs when the slave is willing to complete the transaction; however, it is temproarily unable to accept or provide any data. This condition may occur, for example, if the transaction crosses a resource boundary (such as addressing the data space outside that allocated to a FIFO) or the slave can not meet the initial latency requirements. This condition may occur because the master can not meet the initial timeout latency requirement, is currently locked by another master, or there is a conflict for a internal resource. Since block transfer length is indeterminate, the slave can assert RTR at any time.

Figure 10:
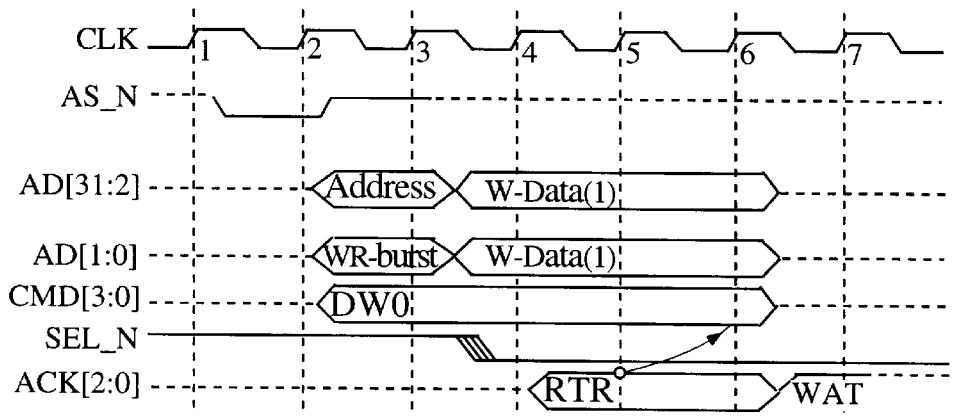
FIG. 10 shows a timing diagram for a slave retry termination without data transfer.
Figure 11:
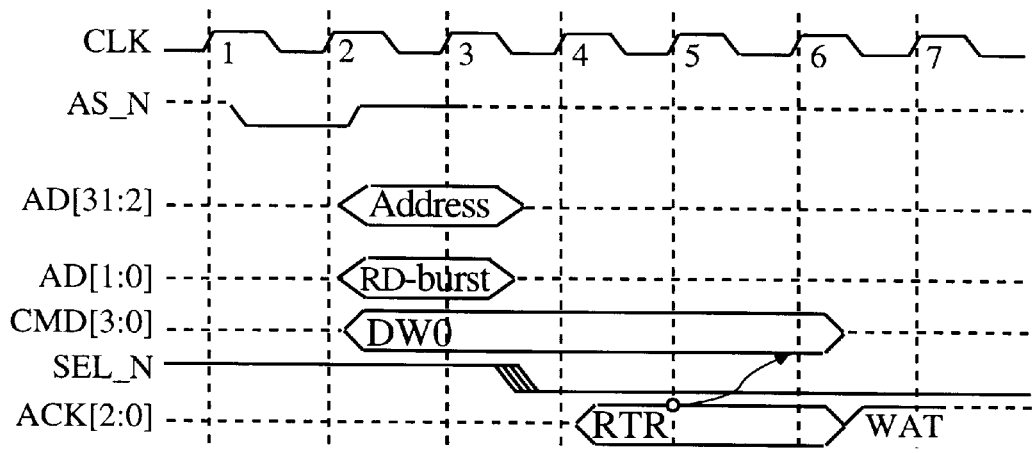
FIG. 11 shows a timing diagram for a slave read retry termination without data transfer.

FIG. 10 shows a slave Write Retry Termination without data transfer. On clock cycle 4, the slave asserts ACK[2:0]=RTR and on clock cycle 6 the write transaction terminates. FIG. 11 shows a Slave Read Retry Termination without data transfer. Similarly, the slave asserts ACK[2:0]=RTR on clock cycle 4, and on clock cycle 6 the read transaction is terminated.

It is recommended that all slaves issue a retry when accessing data from devices with a long latency. This allows other agents to use the bus during the waiting period. Also, to guarantee that data will not be buffered indefinitely and eventually lock up the system for lack of buffers, the master is required to keep retrying the transaction until successful.

3. Retry With Data

Both write and read transactions can also be terminated with data transfer. Such a termination condition occurs when the master initiates an indeterminate length transaction; however, the slave is only willing to complete one data transaction. This condition may occur, for example, if the master initiates a transaction to a slave that can not accept or provide multiple data transfer cycles in one bus transaction.

Figure 12:
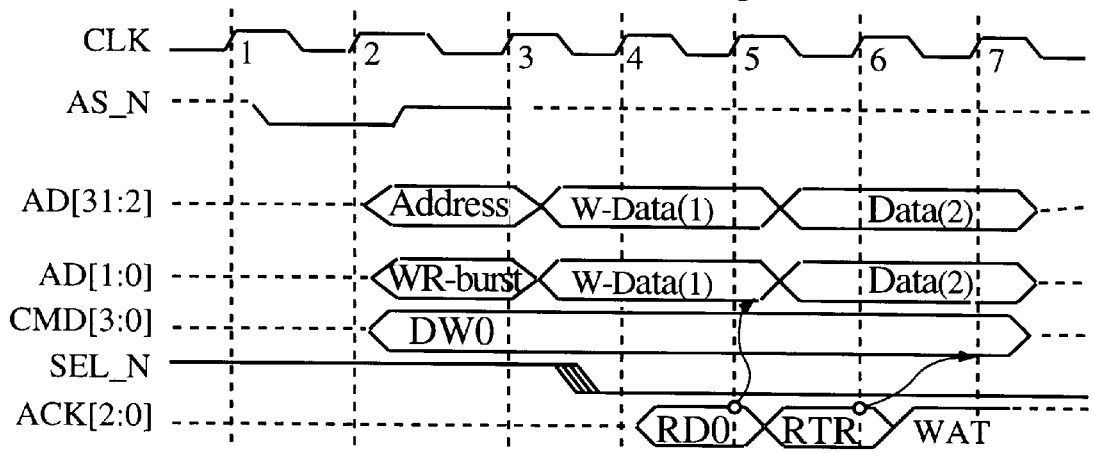
FIG. 12 shows a timing diagram for a slave write retry termination with single data transfer.
Figure 13:
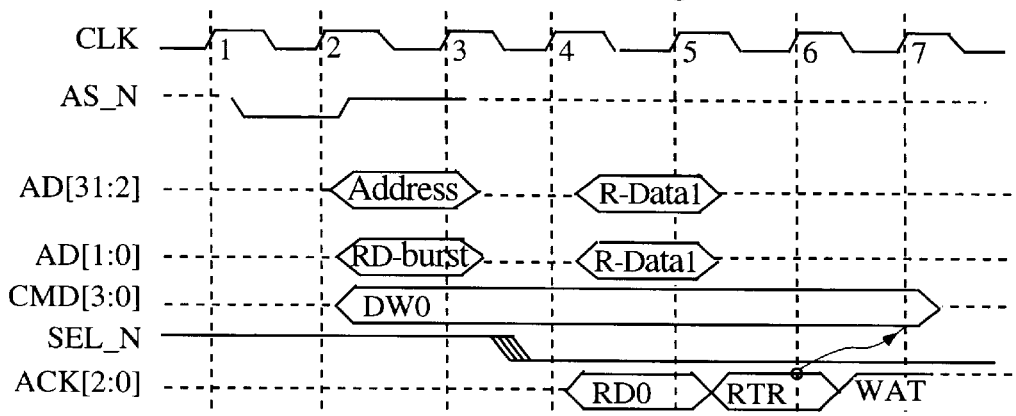
FIG. 13 shows a timing diagram for a slave read retry termination with single data transfer.

FIG. 12 shows a Slave Write Retry Termination with single data transfer. FIG. 13 shows a Slave Read Retry Termination with single data transfer.

4. Slave Error Termination

Figure 14:
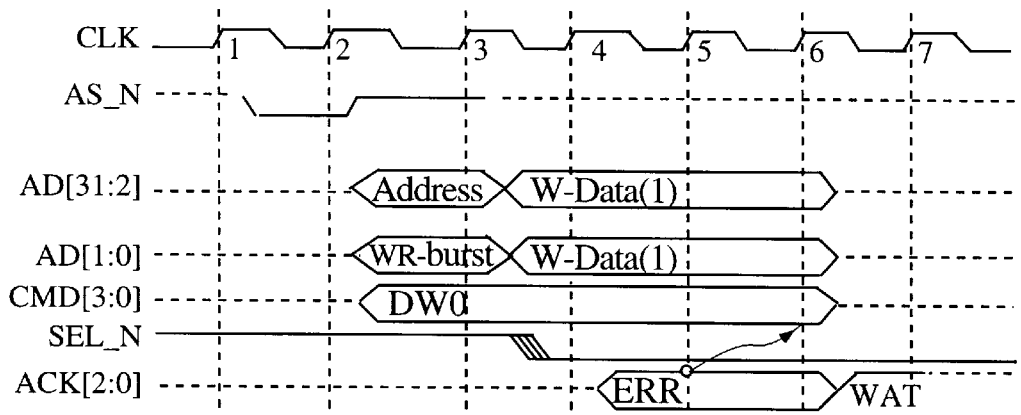
FIG. 14 shows a timing diagram for a slave error termination condition

A slave can initiate an abnormal termination request because the slave detected a fatal error or the slave will not be able to complete the request ACK[2:0]=ERR. Although a slave error termination request signals a catastrophic error condition, the transaction being terminated completes gracefully, thus preserving normal operation for other masters. For example, if a master requests all bytes in an address Dword to be read, but the slave owns only the lower two bytes of the address Dword, since the slave cannot complete the entire request, the slave terminates the request with a slave error termination request. FIG. 14 shows a Slave Error Termination transaction. At clock cycle 4, the slave sets ACK[2:0]=ERR and the transaction ceases at clock cycle 6, which is acknowledged by the slave setting ACK[2:0]=WAT.

Master Initiated Termination

The mechanism used by the master to signal transaction termination is to change the bus command CMD[3:0] from DW0 to NOP. Since pipelined design techniques are necessary to achieve high clock rate, the CMD is switched to NOP on the next to last data cycle. The slave then detects the registered CMD[3:0]=NOP in the last data cycle. This condition signals to the slave that the final data phase is in progress. The transaction reaches completion when registered bus command CMD[3:0]=NOP and Ready-Last acknowledge ACK[2:0]=RD0 are both asserted. One clock cycle after driving RD0 onto ACK for the last data phase of a transfer, the slave drives the ACK to WAT and, another clock cycle later, tri-states ACK. At the same time that the ACK is driven to WAT by the slave, the CMD and AD busses are tri-stated by the master. This provides the turn-around cycle which is required if bus mastership is being changed.

Figure 15:
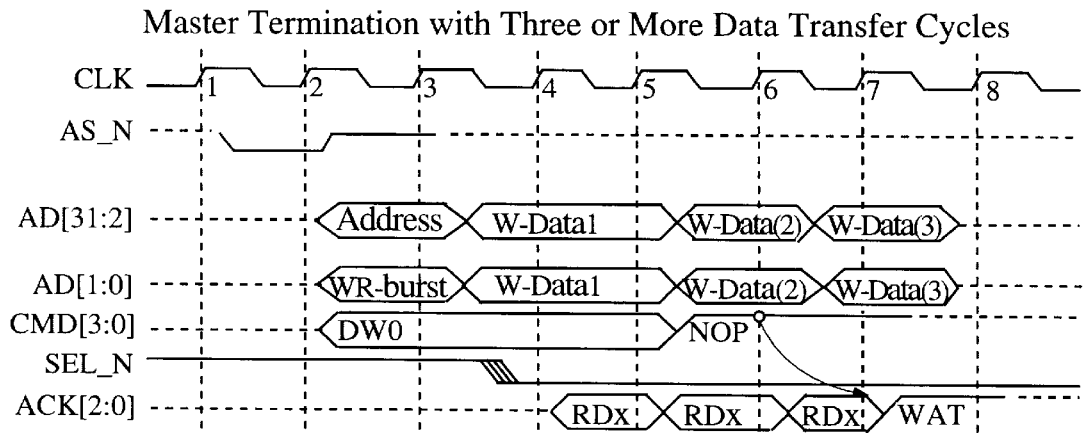
FIG. 15 shows a timing diagram for a master termination with three or more data transfer cycles.
Figure 16:
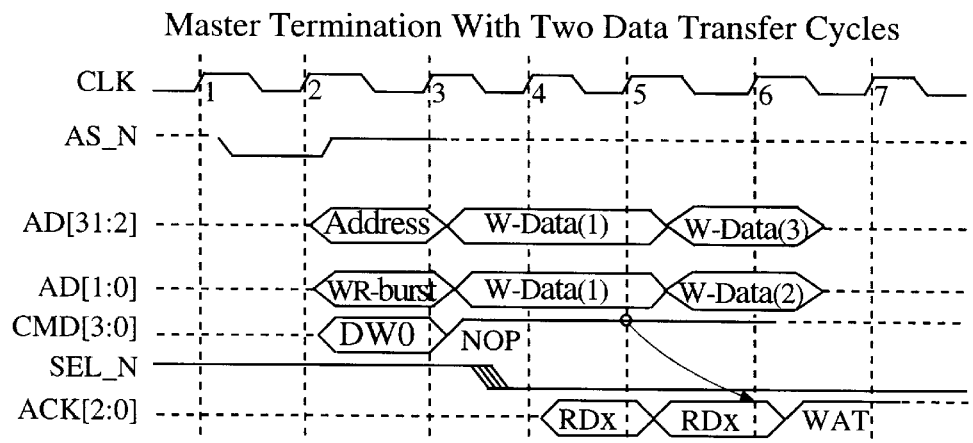
FIG. 16 shows a timing diagram for a master termination with two data transfer cycles.

FIG. 15 shows master termination with three or more data transfer cycles, and FIG. 16 with two data transfer cycles.

Central Controller Initiated Termination

Figure 17:
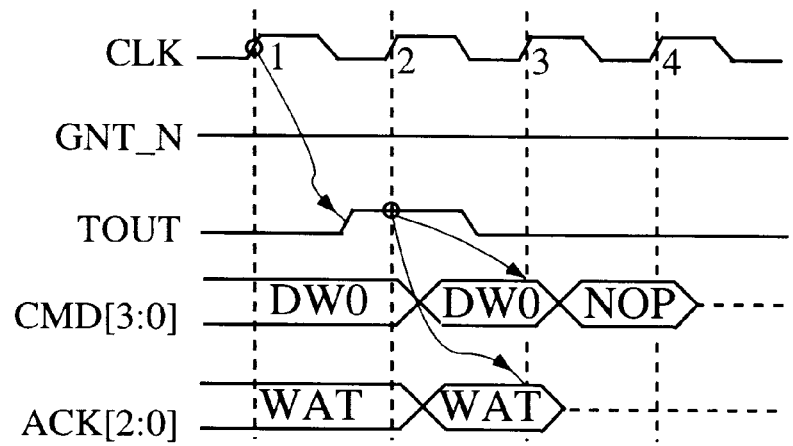
FIG. 17 shows a timing diagram for a time-out initiated termination used to achieve low latency and break deadlock situations.

Timeout initiated termination as shown in FIG. 17 refers to termination when the latency timer of bus control unit 20 has expired. The intended transaction is not necessarily concluded. The timer may have expired because of target induced access latency, because the intended operation was very long, or because no target was selected by the central decoder. In bus systems, there is an inherent tradeoff that must be addressed to achieve low latency and high bandwidth. Low latency is achieved by restricting the length of indeterminate length transfers. High bandwidth is achieved by allowing devices to use long burst transfers.

The timeout feature included in the bus protocol is a programmable timeout counter that controls the tradeoff between high throughput (higher timeout count value) and low latency (lower timeout counter value). A timeout counter which activates TOUT when a bus operation lasts more the programmed number of bus cycles is configurable up to 16 clock cycles. The timeout counter is controlled by the Central Bus Arbiter 20. It should be noted that in other embodiments, the exact value and the mechanism for determining the timeout counter maximum will be up to the discretion of the system designer. The Central Bus Controller provided in one embodiment of the bus has a TimerValue input bus which the user can either tie to a constant value or tie to the output of a register implemented elsewhere.

Figure 18:
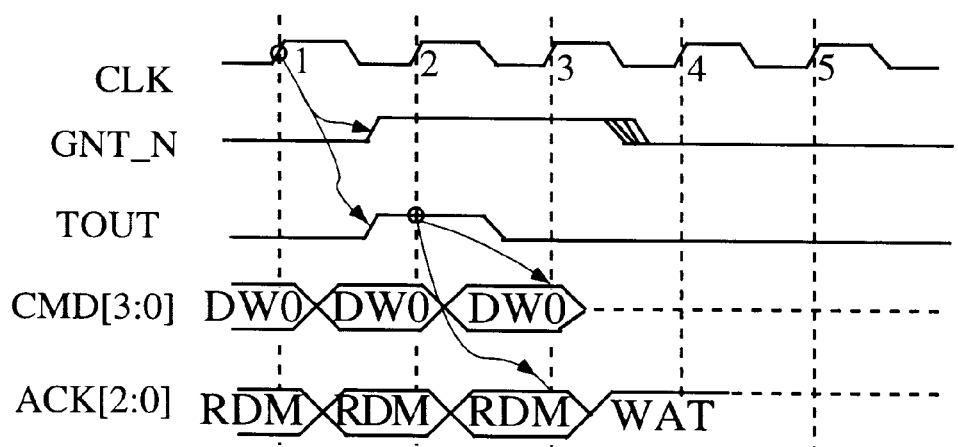
FIG. 18 shows a timing diagram for a time-out initiated termination used to achieve maximum bandwidth.

FIGS. 17 and 18 show the timing of the TOUT signal for two types of timeout termination conditions. The waveforms in FIG. 17 illustrate how TOUT is used to achieve low latency and break deadlock situations. The waveforms in FIG. 18 illustrate how TOUT is used to achieve maximum bandwidth by constraining a master's tenure on the bus and terminating an indeterminate length transaction to a slave that could absorb the data indefinitely.

In both FIGS. 17 and 18, when TOUT becomes asserted (clock cycle 1), the active master and slave shall register the signal in the next to last data phase (clock cycle 2) of the transaction. On assertion of TOUTq (TOUTq is the registered version of TOUT and occurs at the next clock cycle after TOUT is asserted, here on clock cycle 2), the slave drives ACK[2:0]=WAT (if selected and unable to accept the transaction), then tri-states ACK on the next clock cycle. A non-selected slave ignores TOUT. It should be noted, in the case when no slave is selected, the ACK codes shall remain at WAT. In the case when a slave is selected, the slave should have asserted RTR prior to TOUT being asserted.

In FIG. 18, when timeout is used to control bandwidth (higher timeout counter value) and no slave acknowledges the transaction, the master should not repeat the transaction. In FIG. 17 when timeout is used to control low latency (lower timeout counter value), the master should treat TOUT as a retry. To differentiate TOUT-Retry from TOUT-Error, the master must monitor the slave acknowledge signal ACK. If an ACK=RDx signal has occurred during the transaction, the the TOUT signal is a retry. Otherwise the TOUT signal is a fault or error indication. It is recommended that all slaves issue a Retry signal if their initial latency is greater than the TOUT period.

Upon receiving the TOUT command, the active master tri-states CMD, AD, AS_N (should already be tristated), and LOCK_N, and releases bus ownership (even if the bus was locked). In the timeout termination case of FIG. 17, the arbiter may have issued a GNT_N to the next master which is waiting for the end of a transaction in order to occupy the bus, and the new master may start its transaction with an AS_N in the clock cycle after TOUTq. In the timeout termination case of FIG. 18, the Central Bus Arbiter deasserts GNT_N coincident with the assertion of TOUT, guaranteeing a new round of arbitration after TOUT. If the bus was not locked, there are no requests and the arbiter does nothing. If the bus was locked, then the TOUTq assertion breaks the lock. So the arbiter needs to assert a new GNT_N after TOUTq de-asserts.

Circuitry to control the above-described timing is located in the bus controller and/or bus monitor 20 as described above. Implementation of this circuitry is within the skill of one ordinarily skilled in the art in light of the above disclosure.

Description of Modules that Use Bus 8

Each of the modules illustrated in FIGS. 2 and 3 that make use of bus 8 will now be described.

Bus Master

Figure 19:
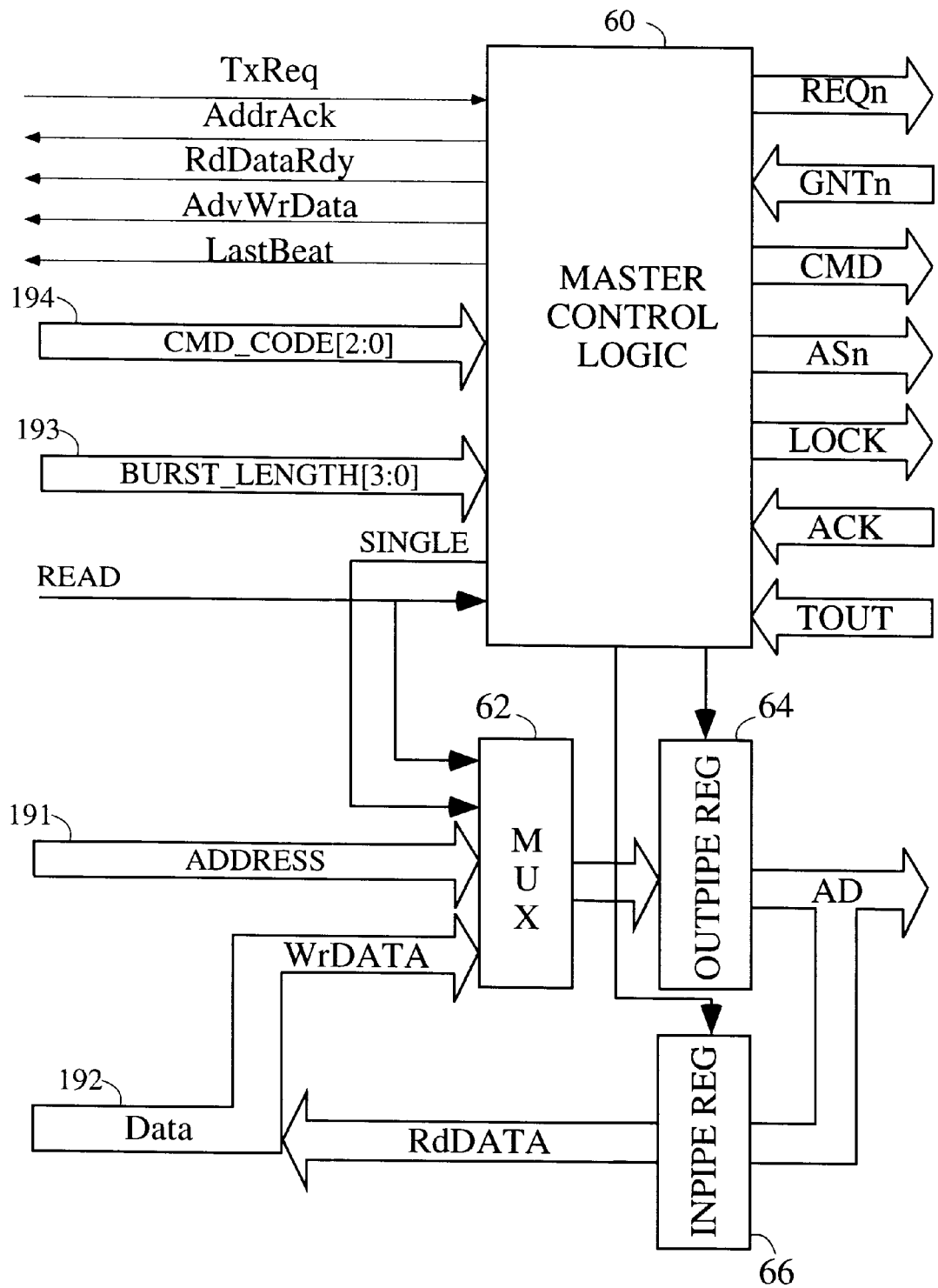
FIG. 19 is a block diagram of a master.

If a module will perform reads and writes to other modules using bus 8, the module needs a master interface with master functionality. FIG. 19 shows a block diagram of a master interface such as 12-E of FIG. 3. The master interface of FIG. 19 includes a master control logic block 60, which serves as a master state machine controller and controls bus access when an interface 12-E requests a bus read or write. Once master 12-E receives a bus access grant GNT_N, master control logic block 60 provides the necessary signals to complete the transfer. Master control logic block 60 provides handshake signals to control data flow, and does this handshaking using the CMD signals to transmit messages to addressed slaves and using the ACK signals to monitor and respond to an addressed slave. Master control logic block 60 also handles sequencing of a response from a bus time-out or retry.

Signals shown at the right side of FIG. 19 correspond to signals at the left side of FIG. 3 that enter or exit master module 12-E. Signals shown at the left side of FIG. 19 are interface signals to the master and may be connected to core logic block signals or to user logic in an FPGA logic block. When user logic located to the left of FIG. 19 is to do a transfer, the user logic sets up its address on ADDRESS bus 191, its data on bus 192, its write enable on line READ, and its transfer attributes on buses 193 and 194, and then asserts TxReq. Master control logic block 60 then asserts ReqN to request the bus, waits for the end of a previous bus master's transfer (if any), obtains a properly addressed GNT_N signal, and then controls multiplexer 62 and OUTPIPE REG 64 to drive the address from bus 191 onto AD. One clock cycle after driving the address onto AD, master control logic block 60 asserts LdAddr (load address), allowing the user logic to change address and other parameters for the next transfer. The RdDataRdy and AdvOutP signals control movement of data through read INPIPE register 66 and OUTPIPE register 64, respectively.

If the user logic is doing a burst of indeterminate length (FIG. 5 or FIG. 7), the user logic must increment the address AD in step with these signals in case a retry becomes necessary. As the transfer proceeds, master control logic block 60 counts down the requested transfer length and terminates the bus transfer. On the last data beat (clock cycle at which data is transferred), master control logic block 60 asserts LastBeat to signal to the user logic that the current RdDataRdy and AdvCutP signals are the last. Table II below shows the signals on the left side of FIG. 19, their signal types, and the definitions of each of the signals.

TABLE II

| Signal Name | Signal Type | Pin Definition |
|---|---|---|
| TxREQ | I | Transfer Request: Indicates that data is ready to be transferred to or from the bus. User provides address, data(if a write), and direction and |

TABLE II-continued

| Signal Name | Signal Type | Pin Definition |
|---|---|---|
| | | burst length, then asserts TxRFQ. |
| LdAddr | O | Load Address: Indicates the master has loaded the address into the output pipeline register. Will assert multiple times for one transfer if retries occur. |
| RdDataRdy | O | Read Data Ready: Signal from the master to the device logic indicating the read data path has read data from the bus. Device logic should use this signal to determine when the master has completed its read transfer and to "clock enable" the RdData down its pipeline. |
| AdvOutP | O | Advance Output Pipe: Signal from the master to the device logic indicating that the output pipeline is moving. If LdAddr is not asserted concurrently, the data path is ready for next write data to the bus. Device logic should use these signals to determine when the master has completed its write transfer and to pipeline the next data when performing a burst transaction of indeterminate length. |
| LastBeat | O | Last Beat: Indicates the master will have completed the bus transaction on the next assertion of AdvOutP and !LdAddr or the next assertion of RdDataRdy. |
| CMDcode[3:0] | I | Command Code: Signal from the device logic indicating to the master what CMD to use. |
| BurstLength[3:0] | I | Burst Length: The number of data beats minus one. If doing a single data beat transfer, should be set to zero. |
| Read | I | Read: Signal from the device logic indicating the direction of the data transfer during the bus transaction. Read = 0: Write data from device logic to bus. Read = 1: Read data from bus to device logic. |
| Address[31:0] | I | Address: Address applied to the bus through the output pipeline register. |
| WrData[31:0] | I | Write Data: Data applied to the bus through the output pipeline register. |
| RdData[31:0] | I | Read Data: Data input registered from the bus. |

Bus Slave

If a module will operate as a passive module addressed via reads and writes by other modules using bus 8, the module needs a slave interface with slave functionality. A slave interface is the addressee of a master interface initiated transfer. Each slave interface is selected and activated via a dedicated slave select signal SEL_N generated by the central bus decoder 20-B of FIG. 3. This SEL_N signal is decoded by decoder 20-B from the address AD issued by the active master.

Figure 20:
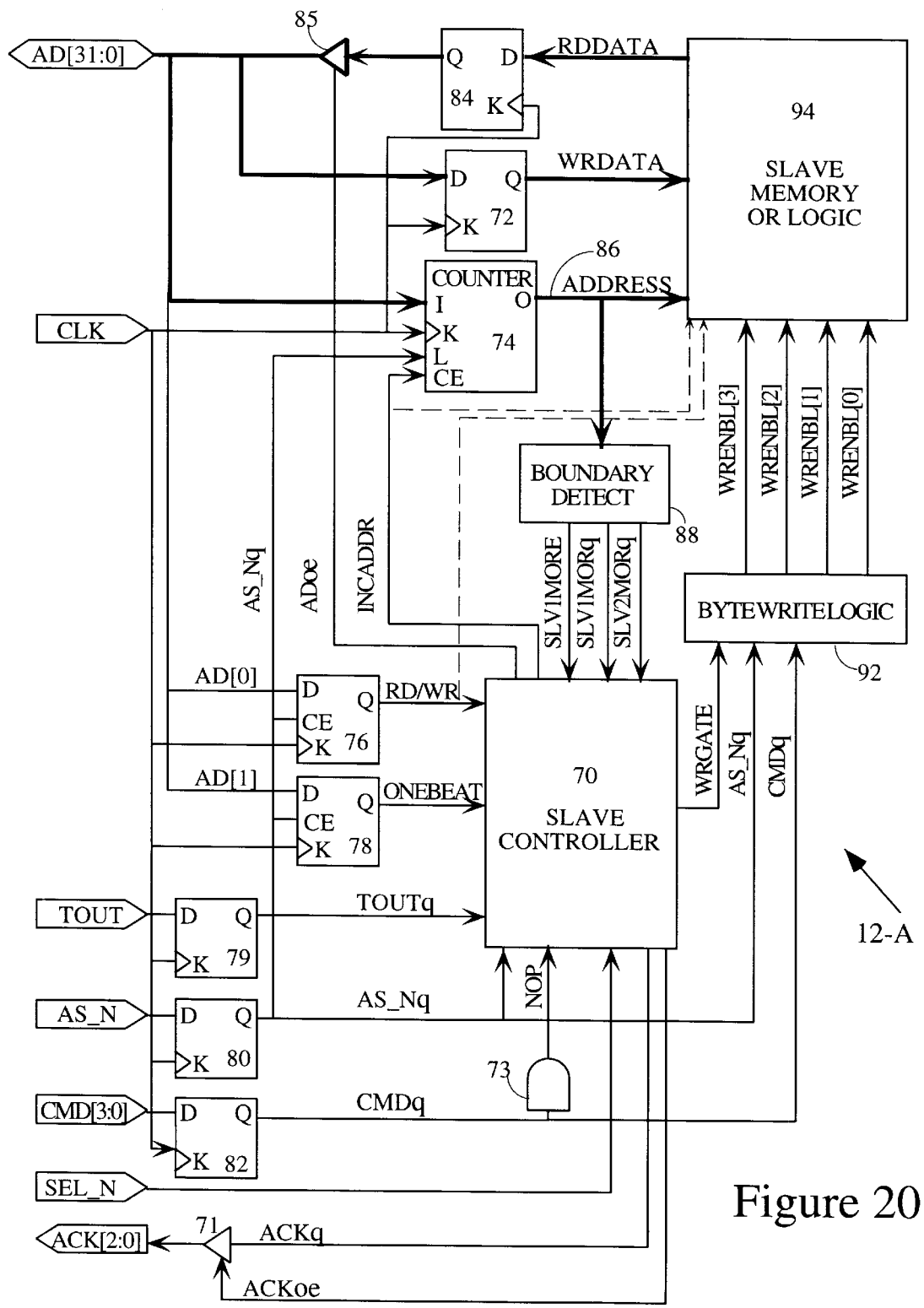
FIG. 20 is a block diagram of a slave.

FIG. 20 shows a block diagram of a slave interface such as 12-A of FIG. 3. The slave interface of FIG. 20 also includes a slave state machine controller 70 that controls access from bus 8 to the associated module (module 12-A in FIG. 1 or 2). Controller 70 generates all control signals to bus 8 and responds to all control signals received from bus 8. Controller 70 also provides for and responds to data flow using the ACK and CMD signals. Controller 70 generates timing for actions such as transferring data, retrying and aborting, and also handles sequencing of a response from a bus time-out or retry.

FIG. 20 illustrates the pipelined nature of the interface. In a slave module, all inputs from bus 8 are connected to registers, and bus 8 is driven only by registers. The AD[31:0] bus is wide enough to address the complete internal memory space in SRAM memory 94. This bus is used for both address and data, and for both read and write addresses. For writing, AD[31:0] drives data input register 72, which drives the internal WRDATA bus. In this embodiment, read data output path RDDATA from memory 94 is always enabled. During reads, the output signal RDDATA is registered in register 84. When the address output enable signal ADoe is active, a tristate buffer 85 is enabled and the registered output data signal is applied to AD[31:0]. In another embodiment, memory 94 is a FIFO. In other embodiments, memory 94 comprises separate registers or other logic.

Table III below illustrates the signals that enter or exit slave module 12-A.

TABLE III

| Signal Name | Signal Type | Pin Definition |
|---|---|---|
| AS_Nq | O | Registered Address Strobe |
| IncAddr | O | Increment Address: Signal from the slave to the device logic indicating the data path has data from the bus. Device logic should use this signal during read transfers to advance the next dread data to the output. Slave logic uses this signal to increment its address counter. |
| ACK[2:0] | I | Acknowledge code lines: |
| wrGate | O | Write Gate: High for each clock cycle in which WrData is written to the memory block. Used to generate the wrEnbl signals. |
| CMDq[3:0] | O | Registered Command Code: Signal from slave indicating to the device logic what kind of bus transaction is being performed. |
| wrEnbl[3:0] | O | Write Enable: Byte write enable signals for each byte of the data path. |
| TOUTq | I | Registered Bus Time Out: Signal from slave indicating the Central Bus Arbiter has asserted time out. An active time out causes any master or slave to stop driving any bus lines, starting on the following bus cycle. An ongoing bus transfer is aborted. |
| RDwr | I | Read: Signal from the bus indicating the direction of the data transfer during the bus transaction. RDwr = 0: Write data from bus to device logic. RDwr = 1: Read data from device logic to bus. |
| wrData[31:0] | I | Write Data: Data input registered from the bus. |
| rdData_D[31:0] | O | Read Data: Data output to the bus through a pipeline register. |

Address lines AD[0] and AD[1] of bus AD[31:0] drive address counters 76 and 78 respectively. As discussed in connection with FIGS. 5 and 7, AD[1] indicates whether a burst of data will follow, and AD[0] selects between a read operation and a write operation.

The TOUT signal is registered in flip flop 79 to produce the TOUTq signal applied to controller 70. A high TOUTq signal holds controller 70 in an idle state.

The address strobe signal AS_N is registered in flip flop 80 to produce the AS_Nq output signal. AS_Nq controls loading of address counter 74. Address counter 74 latches the full address from AD[31:0] and provides an output ADDRESS on bus 86. Depending upon the instruction INCADDR, counter 74 does or does not increment the output ADDRESS at each clock cycle.

The registered address strobe signal AS_Nq also serves as the clock enable signal to RDWR and ONEBEAT registers 76 and 78 and prevent registers 76 and 78 from latching an address prematurely.

Address bus 86 connects address counter 74 to boundary detect logic unit 88 and to slave memory 94. Boundary detect logic unit 88 decodes the address and generates SLV1MORE and SLV2MORE signals. These signals indicate that the address is currently one or two away from the top of the address window of slave 12-A. Boudary detect logic unit 88 includes registers that receive SLV1MORE and SLV2MORE and generate registered SLV1MORq and SLV2MORq signals respectively. These signals initiate a count-down termination in controller 70.

The CMD[3:0] signal is registered in register 82 to generate the CMDq signal, which is applied to byte write logic unit 92. Byte write logic unit 92 also receives the registered AS_Nq output of register 80 as well as the WRGATE output signal from controller 70 and produces individual write enable signals WRENBL[0] through WRENBL[3], one for each byte of the data path. These signals are applied to slave memory unit 94, which in one embodiment is an asynchronous SRAM with separate data-in and data-out connections.

AND gate 73 also receives the CMDq signal. When this signal is 1111, AND gate 73 generates a NOP signal to controller 70, which causes slave controller 70 to terminate a transaction.

The SEL_N signal enables the slave being addressed and is provided to slave controller 70.

For feedback to bus 8, controller 70 provides an acknowledge signal ACKq[2:0] which is applied to a tristate buffer 71 controlled by an acknowledge output enable signal ACKoe. When ACKoe is active ACKq[2:0] is applied to bus ACK[2:0], which is part of bus 8.

Figure 21:
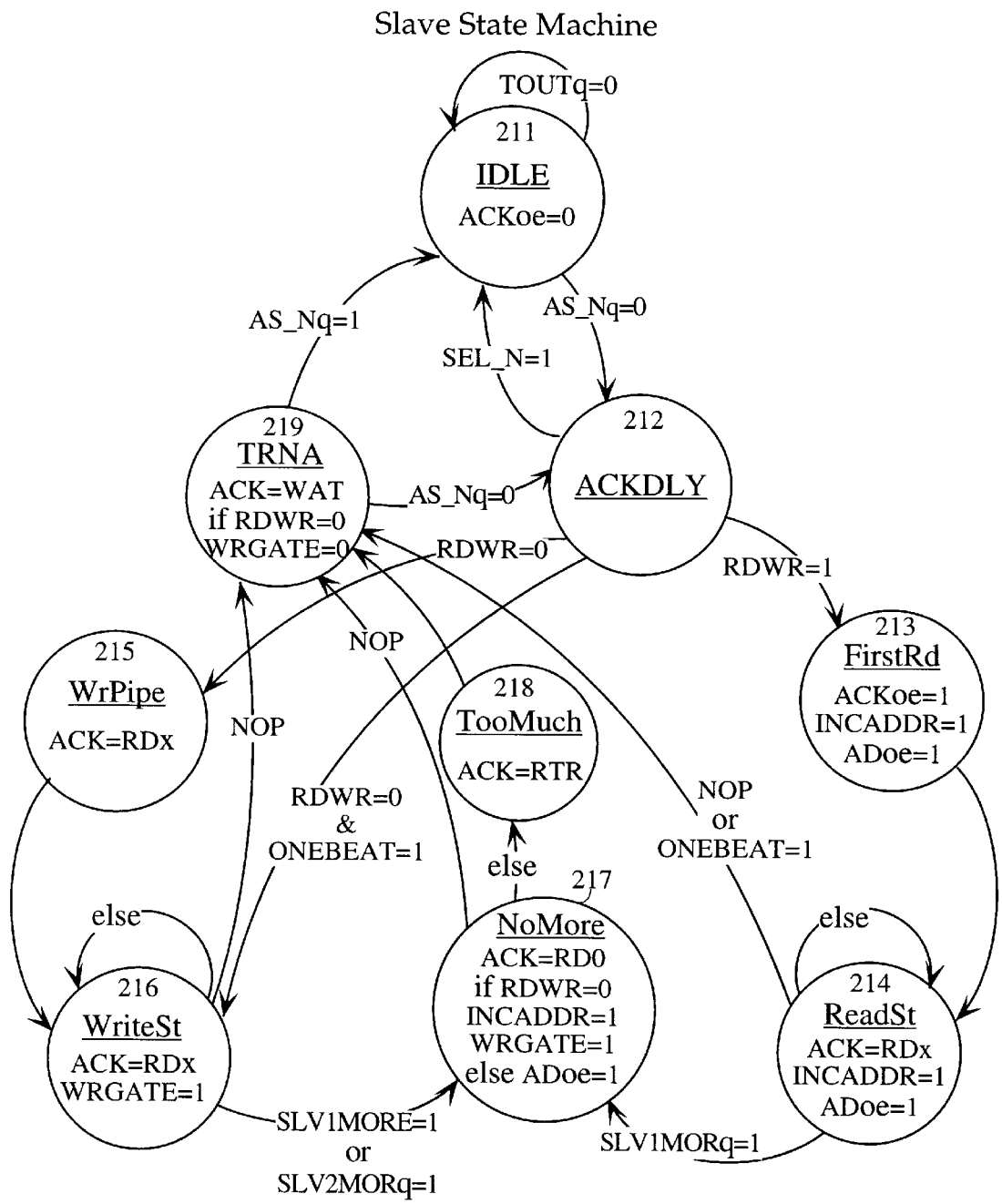
FIG. 21 is a state diagram of a slave control state 70 machine of FIG. 20.

FIG. 21: Slave Controller 70

In order to achieve maximum performance, controller 70 is preferably a one-hot state machine (controller 70 is in only one active state at one time). FIG. 21 shows a state diagram for controller 70. In IDLE state 211, the ACKoe signal is low, so buffer 71 (FIG. 20) is tristated and no acknowledge signal ACK is provided by slave 12-A to bus 8. Controller 70 remains in idle state 211 while bus 8 is idle (AS_N=1 and TOUTq=0. When TOUTq is not active, a low AS_Nq output signal from register 80 moves controller 70 into ACKDLY state 212. However, if SEL_N is not asserted, controller 70 returns to IDLE state 211. Otherwise, from state 212, a low RDWR signal (write) moves controller 70 to WRPIPE state 215 in preparation for writing to slave memory 94. In state 215, the acknowledge signal ACK provides an RDx output signal to bus 8. Another low RDWR signal initiates WRITE state 216 in which writing to memory 94 occurs. In state 216, the acknowledge bus ACK continues to provide the RDx output signal. (The RDx signal was discussed above in connection with FIGS. 4 and 5.) In state 216, the signal WRGATE to byte write logic unit 92 is also brought high to cause byte write logic unit 92 to enable writing to memory 94. Controller 70 remains in state 216 until a NOP signal indicates the end of a transaction or a SLV1MORE or SLV2MORq signal moves controller 70 to state 217. In state 217, if RDWR is 0 and WRGATE is 1 and INCADDR is 1 (meaning the transaction is a write, writing has been initiated, and the transaction is a burst transaction with multiple writes), controller 70 generates an ACK=RD0 to bus 8, thus acknowledging that the transaction is to be terminated. If these three conditions are not true (a write is not in progress), the ADoe line disables buffer 71 and no ACK signal is presented to bus 8 while controller 70 is in state 217. A NOP signal moves controller 70 from state 217 to state 219. Otherwise controller 70 moves to state 218 where controller 70 generates an error signal by sending ACK=RTR and then moves to state 219.

In state 219, termination of the transaction occurs. If the transaction was a write (RDWR is 0 and WRGATE is 1), controller 70 sends ACK=WAT to bus 8. Following this, if the AS_N signal still indicates the slave is selected, controller 70 moves to state 212. Otherwise controller 70 moves to state 211 and remains there until the AS_N signal indicates the slave is selected.

If the transaction is a read operation, RDWR will be high. Thus, from state 212, controller 70 moves to state 213 where it enables the output signal ACK[2:0]=RDx and increments the address with an INCADDR signal. From state 213, controller 70 moves to state 214 where reading of the data from memory 94 occurs. Controller 70 remains in state 214 while addressed memory cells are being read, until a NOP signal on bus CMD[3:0] is received (a value 1111 causes AND gate 73 to go high), or a high signal on address line AD[1] indicates one beat remains. These conditions cause controller 70 to move to state 219. Alternatively, in state 214, asserting of the SLV1MORq signal (to indicate one data transfer remains before the resource boundary will be crossed) causes controller 70 to move to state 217. In state 217, controller 70 asserts ACKq=RD0. If the operation is a write operation and state 217 has been reached from state 216, controller 70 sets WRGATE=1 and INCADDR=1, thus enabling counter 74 and enabling byte write logic block 92. Byte write logic block 92 decodes the transfer width from CMDq[3:0] and selects lanes of slave memory 94. If the operation is a read operation and state 217 has been reached from state 214, controller 70 simply maintains ADoe=1. From state 217, a NOP signal on bus CMD[3:0] moves controller 70 to state 219. Otherwise, controller 70 moves to state 218 and the slave signals a retry to the master by setting ACK=RTR.

Finally, in state 219, controller 70 terminates the transaction by setting ACK=WAT, and if RDwr=0 (a write was occurring), WRGATE is set to 1 to disable writing to memory 94.

Thus controller 70 of FIG. 20 can be built as a state machine following the above state diagram, and controller 70 can respond to the illustrated input signals by generating the illustrated output signals as specified.

Figure 22:
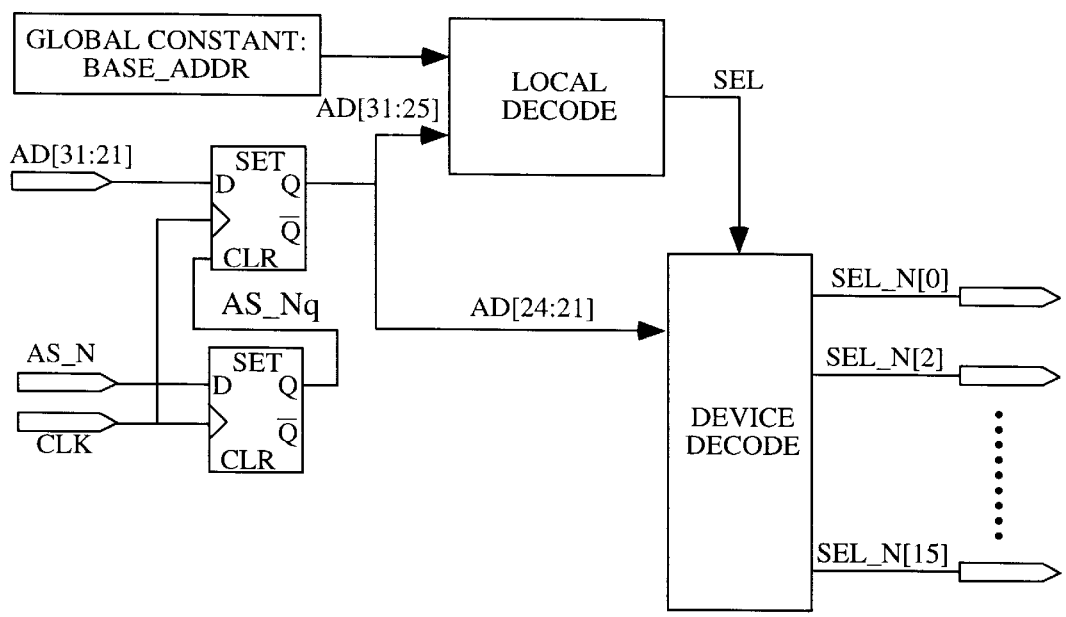
FIG. 22 is a block diagram of a central address decoder 20-B of FIG. 3.

FIG. 22: Central Address Decoder

Address decoding takes place at central decoder 20-B located in bus controller unit 20 (FIG. 2 or FIG. 3) or alternatively it is distributed amongst the slave interfaces. For central decoding, as shown in FIG. 22, First, from address bus AD[31:0], the high order address bits AD[31:21] required by this decoder are registered in register 100 under control of the registered signal AS_Nq which is provided by register 110. Next, the high order portion of the registered address, bits AD[31:25] is compared by decode logic 104 to a global constant stored in global constant memory 102 to determine if one of the local slave interfaces connected to bus 8 is addressed. If so, the SEL signal is asserted by decode logic 104 and the device decoder 108 is enabled. As shown in FIG. 22, up to 16 slave select signals SEL_N[0] through SEL_N[15] can be generated in the second stage of decoding. Preferably, all slaves have the same address space width, and preferably the addresses of the slaves are configurable. The SEL_N output signals are asserted early in the clock cycle following the assertion of the registered signal AS_Nq and arrive at the slave interface early enough so that input registers are not required at the slaves.

Figure 23:
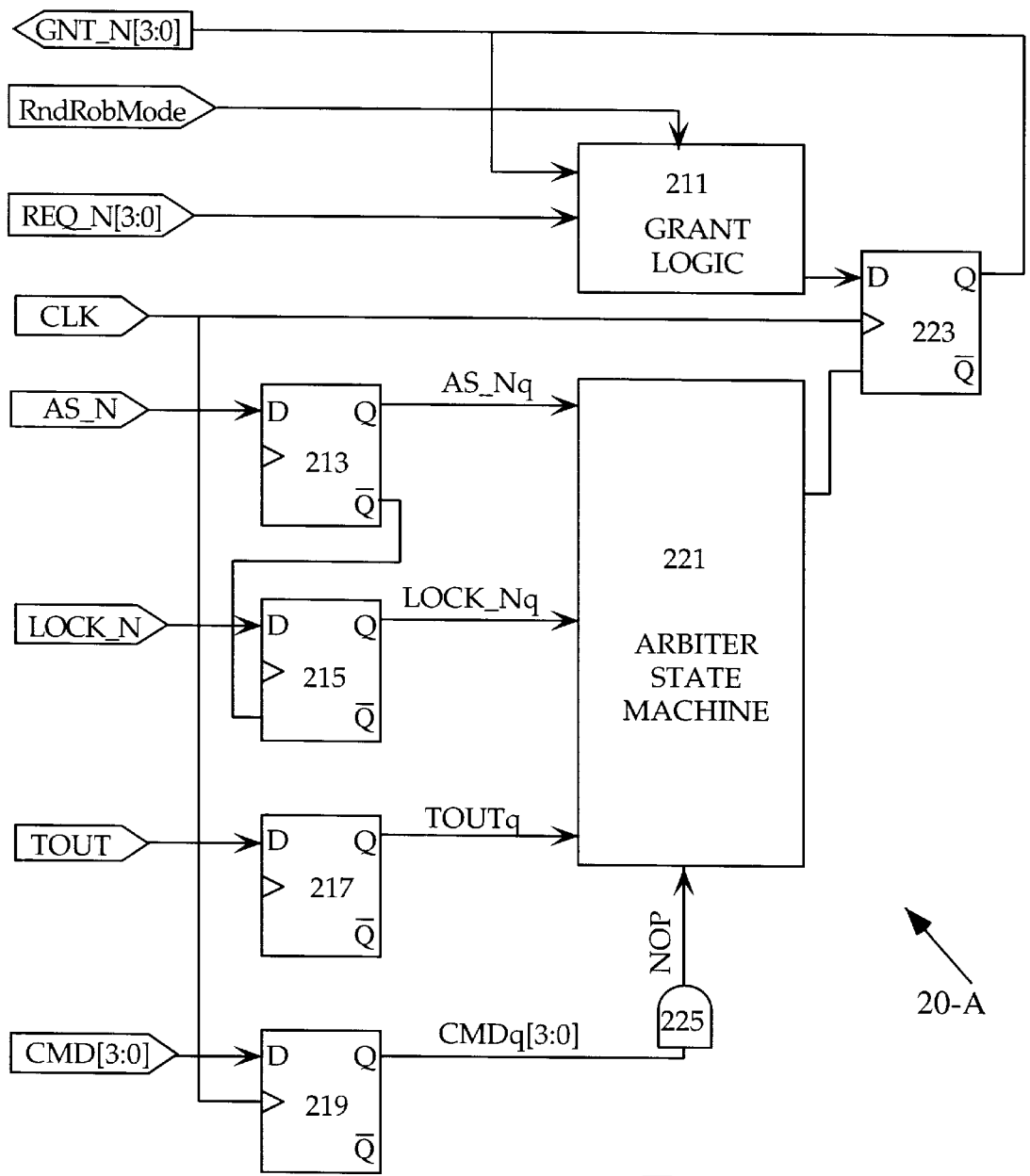
FIG. 23 is a block diagram of a bus arbiter 20-A of FIG. 3.

FIG. 23: Central Arbiter 20-A

A block diagram for an arbiter (arbitration circuit) 20-A which is located in bus control unit 20 in FIGS. 2 and 3 is shown in FIG. 23. Point to point signalling allows the arbiter 20-A to operate on the non-registered REQ_N[3:0] signals. Grant logic unit 211 produces the registered GNT_N[3:0] signals. A control signal RndRobMode from bus control unit 20 selects whether grant logic unit 211 will grant bus ownership to masters on a round robin rotating basis or on a fixed priority basis. In rotating priority mode, the new GNT_N[3:0] signal depends on the current GNT_N signal as well as the current REQ_N signal.

A four state arbiter state machine 221 tracks bus signals AS_N, LOCK_N, and TOUT. Registers 213, 215, and 217 provide registered versions of these signals AS_Nq, LOCK_Nq, and TOUTq. Unless AND gate 225 receives a 1111 input signal from CMD[3:0] and provides a NOP signal to arbiter state machine 221, at the next clock edge after assertion of AS_Nq, if TOUTq is not asserted and LOCK_Nq is not asserted, arbiter state machine 221 asserts a NewGnt signal to enable flip flop 223. If TOUTq is asserted, a NewGnt signal is asserted only if LOCK_Nq is asserted.

Figure 24:
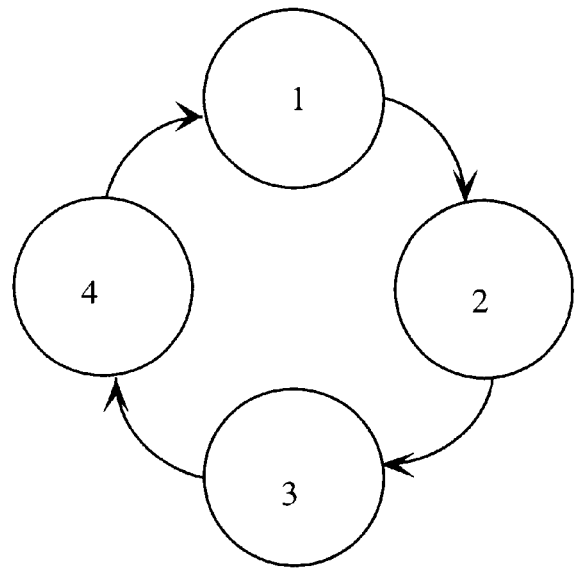
FIGS. 24 and 25 illustrate two ways to determine priority for four masters requesting bus control.
Figure 25:
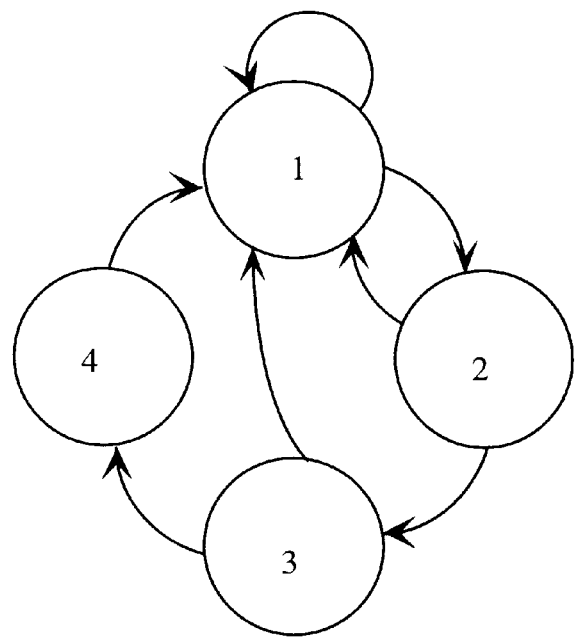

FIGS. 24 and 25 illustrate how priority can be determined for four masters requesting bus control. FIG. 24 shows the round robin rotation basis and FIG. 25 shows the fixed priority basis. In FIG. 24, if four masters 1, 2, 3, and 4 are simultaneously requesting bus access, bus control unit 20 will first give control to master 1 by placing SEL_1 onto the bus. After the master 1 transaction is complete, bus control unit 20 gives control to master 2, then 3, then 4. If master 2 ceases requesting bus control while master 1 has control, then at the end of the master 1 transaction, bus control unit 20 will pass control to master 3, and so on.

In FIG. 25, first priority goes to master 1. Other masters have decreasing priority in numerical order. Thus if masters 1 and 2 are requesting bus control simultaneously, control goes to master 1. At the end of a transaction by master 1, bus control unit 20 checks on which masters are requesting the bus. If master 1 is again requesting the bus, control goes back to master 1. Only when master 1 is not requesting the bus will control go to master 2. Only if neither master 1 nor master 2 are requesting the bus at the end of a transaction will control go to master 3. And master 4 is given control of the bus only when no other master is requesting control at the end of a transaction.

The disclosure is illustrative and not limiting; further modifications will be apparent to one skilled in the art in light of this disclosure and are intended to fall within the scope of the appended claims. For example, bus monitor 26 of FIG. 2 can be replaced by a monitor externally attached to bus 8 to check for bus protocol violations. If there are any violations in the protocol, the external monitor can provide an error message identifying the protocol rule that is violated and giving the time at which the error occurred.

I claim:

1. An integrated circuit device comprising:

a bus comprising a plurality of bus lines;

a plurality of modules, at least one of the modules comprising an FPGA, the FPGA comprising:
  a plurality of configurable logic blocks; and
  a plurality of interconnect lines for interconnecting the logic blocks;
  for each module, an associated interface structure for driving signals from the module onto the bus lines and for applying signals on the bus lines to the module means for configuring the bus and the FPGA; and a bus arbiter coupled to the bus for selecting which of the interface structures can drive signals onto the bus.

2. An integrated circuit device as in claim 1 wherein at least one of the interface structures is programmable.

3. An integrated circuit device as in claim 1 wherein at least one of the interface structures has a fixed function.

4. An integrated circuit device as in claim 1 wherein at least one of the modules is not programmable.

5. An integrated circuit device as in claim 1 wherein the bus arbiter further selects which of the interface structures can receive signals from the bus.

6. An integrated circuit device as in claim 1 wherein:

a plurality of the interface structures are programmable to serve as masters for driving signals onto the bus, and the arbiter assigns a programmable priority order to the masters.

7. An integrated circuit device as in claim 1, wherein the bus arbiter is programmable in selecting an arbitration scheme.

8. An integrated circuit device as in claim 6, in which the priority order includes a round robin basis.

9. An integrated circuit device as in claim 6, in which the priority order includes a fixed basis.

10. An integrated circuit device as in claim 1 wherein:

the interface structure associated with the FPGA module includes means for accessing configuration memory associated with the FPGA module from the bus; and the interface structure associated with the FPGA module includes means for recognizing a configuration command for programming the FPGA modules from the bus and responds to the configuration command by passing subsequent data to the configuration memory.

11. An integrated circuit device as in claim 1 wherein the modules each include scan test structures and each of the interface structures includes circuitry for passing scan test information from external terminals of the integrated circuit device to individual modules connected to the bus.

12. An integrated circuit device as in claim 11 wherein the scan test information is one of a JTAG or built-in self-test protocol.

13. An integrated circuit device as in claim 1 wherein one of the modules is programmed to monitor the bus and to provide diagnostic or transaction information associated with the bus to external terminals of the integrated circuit device.

14. An integrated circuit device as in claim 1 further comprising a fixed function monitor coupled to the bus to monitor the bus and to provide diagnostic or transaction information associated with the bus to external terminals of the integrated circuit device.

15. An integrated circuit device as in claim 1, further comprising:

at least one core logic module; and an interface between the core logic module and the bus.

16. An integrated circuit device comprising:

a bus comprising a plurality of bus lines;

a plurality of modules, at least one of the modules comprising an FPGA, the FPGA comprising:

a plurality of configurable logic blocks, and a plurality of interconnect lines for interconnecting the logic blocks;

for each module, an associated interface structure for driving signals from the module onto the bus lines and for applying signals on the bus lines to the module; and means for configuring the bus and the FPGA;

wherein at any time only one master of the interface structures drives signals onto the bus and the master selects which of the interface structures can receive signals from the bus.

17. An integrated circuit device comprising:

a bus comprising a plurality of bus lines;

a plurality of modules, at least one of the modules comprising an FPGA, the FPGA comprising:

a plurality of configurable logic blocks, and a plurality of interconnect lines for interconnecting the logic blocks;

for each module, an associated interface structure for driving signals from the module onto the bus lines and for applying signals on the bus lines to the module; and means for configuring the bus and the FPGA;

wherein at any time one of the modules is a master and each of the interface structures decodes a command from the master to detect when the associated interface structure is to receive signals from the bus.

18. An integrated circuit device comprising:

a bus comprising a plurality of bus lines;

a plurality of modules, at least one of the modules comprising an FPGA, the FPGA comprising:

a plurality of configurable logic blocks, and a plurality of interconnect lines for interconnecting the logic blocks;

for each module, an associated interface structure for driving signals from the module onto the bus lines and for applying signals on the bus lines to the module; and means for configuring the bus and the FPGA;

wherein the interface structures comprise a plurality of masters and each of the masters determines bus availability upon needing the bus and becomes a driver when the bus is found to be idle.

19. An integrated circuit device comprising:

a plurality of FPGA modules;

a bus interconnecting the FPGA modules; and a bus arbiter coupled to the bus for selecting which of the FPGA modules can drive signals onto the bus.

20. An integrated circuit device as in claim 19, wherein the bus arbiter further selects which of the FPGA modules can receive signals from the bus.

21. An integrated circuit device as in claim 19, wherein:

a plurality of the interface structures are programmable to serve as masters for driving signals onto the bus, and the arbiter assigns a programmable priority order to the masters.

22. An integrated circuit device as in claim 21, in which the priority order includes a round robin basis.

23. An integrated circuit device as in claim 21, in which the priority order includes a fixed basis.

24. An integrated circuit device as in claim 19, wherein the bus arbiter is programmable in selecting an arbitration scheme.

25. An integrated circuit device comprising:

a plurality of FPGA modules; and a bus interconnecting the FPGA modules;

wherein at any time only one master of the FPGA modules structures drives signals onto the bus and the master selects which of the FPGA modules can receive signals from the bus.

26. An integrated circuit device comprising:

a plurality of FPGA modules; and a bus interconnecting the FPGA modules;

wherein at any time one of the FPGA modules is a master and each of the FPGA modules decodes a command from the master to detect when the associated FPGA module is to receive signals from the bus.

27. An integrated circuit device comprising:

a plurality of FPGA modules; and a bus interconnecting the FPGA modules;

wherein the FPGA modules comprise a plurality of masters and each of the masters determines bus availability upon needing the bus and becomes a driver when the bus is found to be idle.

* * * * *